United States Patent [19]

Poplevine

[11] Patent Number: 5,721,545
[45] Date of Patent: Feb. 24, 1998

[54] METHODS AND APPARATUS FOR SERIAL-TO-PARALLEL AND PARALLEL-TO-SERIAL CONVERSION

[76] Inventor: Pavel B. Poplevine, 149 Hagar Ct., Santa Cruz, Calif. 95064

[21] Appl. No.: 551,933

[22] Filed: Oct. 23, 1995

[51] Int. Cl.$^6$ .............................. H03M 1/36; H03M 1/76
[52] U.S. Cl. ............................................. 341/100; 341/101
[58] Field of Search ................................. 341/100, 101; 327/407, 415

[56] References Cited

U.S. PATENT DOCUMENTS

| | | |
|---|---|---|
| 3,656,011 | 4/1972 | Weinberg . |
| 3,660,697 | 5/1972 | Berglund et al. . |
| 3,885,167 | 5/1975 | Berglund . |
| 4,009,468 | 2/1977 | Calcagno et al. . |
| 4,099,197 | 7/1978 | Ibrahim et al. . |
| 4,213,120 | 7/1980 | Buchanan . |
| 4,347,587 | 8/1982 | Rao . |
| 4,636,986 | 1/1987 | Pinkham . |
| 4,731,594 | 3/1988 | Kumar . |
| 4,799,040 | 1/1989 | Yanagi . |
| 5,101,203 | 3/1992 | Gersbach et al. . |
| 5,218,363 | 6/1993 | LeCroy, Jr. et al. . |
| 5,243,599 | 9/1993 | Barreh et al. ............. 370/112 |
| 5,319,369 | 6/1994 | Majos et al. . |

OTHER PUBLICATIONS

Wakerly, "Digital Design: Principles & Practices" (2d. Ed. 1994) pp. 64, 606–608.
Weste et al., "Principles of CMOS VSLI Design: A Systems Perspective" (2d. Ed. 1993) pp. 7–11, 19–20, 318–322.
Miyauchi et al., 100-MHz Serial Access Architecture for 4-Mb Field Memory, IEEE Journal of Solid State Circuits, vol. 26, No. 4, Apr. 1991, pp. 555–559.
Siemens AG, ICs for Entertainment Electronics, 868352–Bit Dynamic Sequential Access Memory TV–SAM, SDA 9251X, Data Sheet 07.91.
Siemens AG Memory Products Division, HDTV–SAM 313 344 × 9 / 460 800 × 9 Bit Configurable Field Memory, Preliminary Draft Jun. 1992.
Hitachi, HM53051P Data Sheet, pp. 330–339, (no date given).
Hitachi, HM534251 Series Data Sheet, pp. 444–463, (no date given).
Micron Semiconductor, Inc., MT4364257A/8A 265 × 4 Triple–Port DRAM Data Sheet, Jun. 1994, pp. 4–1 to 4–46.
Bursky, "Trehportovoe Dinamicheskoe ZUPV, Povyshaiyschee Skorost Peredachi Dannyh." Russian translation of article by Dave Bursky, Triple–Port Dynamic RAM Accelerates Data Movement, ED, 1990, No. 10, pp. 37, 38, 42, 43.
Boonstra, et al., "Analog Functions Fit Neatly onto Charge Transport Chips", Electronics, Feb. 28, 1972, pp. 64–71.
Electronics, Special Report, vol. 45, No. 5, Feb. 28, 1972, pp. 3, 62–77.

*Primary Examiner*—Brian K. Young
*Assistant Examiner*—Peguy JeanPierre
*Attorney, Agent, or Firm*—Skjerven, Morrill, MacPherson, Franklin & Friel; Michael Shenker

[57] ABSTRACT

A serial-to-parallel (S/P) converter includes a tree of S/P cells. The tree level 1 includes one cell with two or more latches. The inputs of the latches are connected to the serial data input of the converter. The output of each latch is connected to the input of another multi-latch cell of level 2. The output of each latch of level 2 is connected to the input of a cell of level 3, and so on. In each cell, each latch latches respective bits from the cell input. Different latches latch different bits so that the cell converts the serial data on the cell input to parallel data on the outputs of the cell's latches. The serial data stream on the output of a latch of a tree level other than the highest level is converted to parallel data by higher-level cells. Latches of higher levels are clocked at lower frequencies than latches of lower levels. In some embodiments, latches of levels 3 and higher can be made slower than latches of level 1 without reducing the converter's input frequency. Hence, the peak transient current and power consumption are reduced. Similar P/S converters are also provided.

62 Claims, 20 Drawing Sheets

METHODS AND APPARATUS FOR SERIAL-TO-PARALLEL AND PARALLEL-TO-SERIAL CONVERSION

BACKGROUND OF THE INVENTION

The present invention relates to data processing, and more particularly to serial-to-parallel (S/P) and parallel-to-serial (P/S) data conversion.

Many computers and other digital systems transmit and store data in a parallel format. For this format, a separate signal line is provided for each bit of a multiple-bit data word. An advantage of the parallel format is that all bits of a data word can be written, read or processed simultaneously. Other systems use more cost effective serial data transmission in which a single line is provided for multiple bits of a data word. See J. F. Wakerly, "Digital Design: Principles & Practices" (2nd Ed. 1994), page 64.

Serial-to-parallel (S/P) converters convert data from a serial format to a parallel format when needed. Parallel-to-serial (P/S) converters convert data from a parallel format to a serial format. See "Digital Design", quoted above, pages 606–608 describing use of shift registers as S/P and P/S converters. Shift registers make fast S/P and P/S converters. However, there still exists a need for fast converters having a low peak transient current (i.e. the maximum rate of change of the current) and low power consumption.

SUMMARY OF THE INVENTION

The present invention provides in some embodiments S/P and P/S converters that are faster than shift registers built of elements having the same switching speed. At the same time, the peak transient current in converters of some embodiments of the invention is lower than in shift registers for the same binary word length N of parallel data. Consequently, the converters of some embodiments of the invention generate less noise and thus have lower error rates. Further, the power consumption is low in some embodiments.

More particularly, as is well known, a shift register converter for parallel data word length N includes N master/slave cells each of which includes a master latch and a slave latch. The shift register converter is clocked by two opposite-phase clocks. On each pulse of any one of the clocks, all the N master latches or all the N slave latches read and store a bit of data. If the serial data bits processed by the converter are an alternating sequence of 0's and 1's (for example, 010101 ... ), N latches switch states on each clock pulse, generating a peak transient current N*Ip where Ip is the peak transient current generated by one latch, and consuming much power. High peak transient currents disturb the circuit operation and may result in wrong data being generated in the circuit. High peak transient currents also require power supplies capable of supplying such transient currents. To reduce the peak transient current and the power consumption, shift register latches are made slower, which undesirably reduces the converter speed.

The inventor has observed that a shift register S/P converter provides output bits at only 1/Nth of the frequency of data on the serial input line. Similarly, a shift register P/S converter receives bits at 1/Nth of the frequency of the serial output line. Accordingly, in some S/P converters of the present invention, some latches that deliver input bits to the output lines are slower than the latches that receive the bits from the serial input line. Similarly, in some P/S converters of the invention, some latches that deliver input bits from the input lines are slower than the latches that provide the bits to the output line. The peak transient current and the power consumption are reduced as a result. Of note, in the shift register each input bit is shifted to its output line by latches all of which operate at the same switching speed as the latch connected to the serial line.

Further, in some embodiments of the present invention only N/2 latches switch simultaneously where N is the output data word length. As a result, the peak transient current is reduced further.

These advantages are achieved in some embodiments by converters organized as a tree of multi-latch cells. In some S/P converter embodiments, the tree level 1 includes one cell with two latches. The inputs of the latches are connected to the serial data input of the converter. The output of each latch is connected to the input of a separate two-latch cell of tree level 2. The output of each latch of level 2 is connected to the input of a cell of level 3, and so on. The total number of levels is LogN=Log$_2$N.

The two latches of level 1 are clocked by two non-overlapping clocks of a frequency equal to ½ of the frequency of the input data. Every second bit of the input data is latched by one of the two latches, and the other bits are latched by the other one of the two latches. Thus, all the odd bits are latched by one latch, and all the even bits are latched by the other latch. The bits at the outputs of the two latches of level 1 form 2-bit parallel words. Thus, the cell of level 1 is an S/P converter for the word length of 2. Each latch of level 1 is clocked at half the frequency of the input data. The output bits of these latches are also provided at half the frequency of the input data.

The serial data stream at the output of each latch of level 1 is converted to the stream of parallel words of length 2 by a respective cell of level 2. All the outputs of the latches of level 2 form 4-bit parallel words. The latches of level 2 are clocked at half the frequency of level 1.

Similarly, the latches of the last level LogN=Log$_2$N are clocked at half the frequency of the previous level, that is, at 1/Nth of the frequency of the serial input data.

In some embodiments in which each cell includes two latches, all the cells of any given level i are clocked by two non-overlapping clocks. One of the two clocks is supplied to one of the two latches in every cell at level i, and the other one of the clocks is supplied to all the other latches at level i. Hence, at each level i at most one half of the latches switches states simultaneously. The clocks at different levels are such that no two latches at different levels switch simultaneously. Hence, the largest number of latches that switch simultaneously is N/2, for N/2 latches at level LogN. The peak transient current generated by the latches is thus only (N/2)*Ip.

Moreover, in some embodiments each level starting with at least level 3 uses slower latches without degrading the output frequency of the S/P converter. The peak transient current and the power consumption are further reduced as a result.

In some embodiments, the latches at each level starting with level 3 are twice slower than the latches of the previous level. However, the total number of latches that switch simultaneously at any given level is twice greater than the number of latches that switch simultaneously at the previous level. Hence, the peak transient current is the same at each level starting with level 2. In some embodiments in which no two levels switch simultaneously, the total peak transient current of the converter equals the peak transient current of level 2 and is independent of the word length N. In some embodiments, different levels can switch simultaneously, and the total peak transient current of the converter is LogN times the peak transient current of level 2. In such embodiments, the total peak transient current is directly proportional to LogN rather than to N as in a shift register.

Further, in such embodiments the average power consumption of each latch of any given level starting with level 3 is ¼ of the power consumption of any one latch of the previous level. More particularly, the power consumption of a given latch of levels 3 and higher is reduced by a factor of 2 compared to a latch of the previous level because the given latch is twice slower than a latch of the previous level. In addition, the average power consumption is reduced by another factor of 2 because the frequency of the given latch is one half of the frequency of a latch of the previous level. Thus, the average power consumption of a single latch is ¼ of the average power consumption of a latch of the previous level. Because a given level has twice the number of latches of the previous level, the average power consumption of all the latches at any given level starting with level 3 is one half of the power consumption of all the latches at the previous level. Thus, the power consumption values for successive levels form a geometrical progression, and the total power consumption of all the latches at all the levels starting with level 2 is less than $2P_2$, where $P_2$ is the power consumption of level 2. In some embodiments, the power consumption of levels 1 and 2 is the same, and hence the total power consumption of all the latches of the converter is less than $3P_2$. The $3P_2$ bound is independent of the word length. (This computation does not take into account power consumed by clock generators.) In contrast, the power consumption of the shift register latches is directly proportional to the word length and does not have an upper bound.

As soon as a level 1 latch has stored an input bit, the input data are allowed to change to provide the next input bit. The next input bit can then be read by the other latch of level 1. Thus, the minimum period for the serial input data is equal to the time to store one bit of data in one latch plus the transition time on the serial input line. By contrast, for a shift register, the minimum period for the serial input data is the time to store one bit by two serially connected latches—the input bit is stored by a master latch and then by a slave latch. This is twice the time to store a bit by one latch. Thus, in some embodiments, the S/P converters of the invention allow higher frequencies of input and output data than a shift register built of latches of the same speed.

In some S/P converter embodiments, a cell has more than two latches whose inputs are connected to the cell's input. The cell has more than two outputs which are the outputs of the respective latches.

In some embodiments, a cell with two outputs has three latches L1, L2, L3. The inputs of latches L1, L2 are connected to the cell input. The output of latch L1 is connected to one of the cell outputs. The output of latch L2 is connected to the input of latch L3 whose output is connected to the other output of the cell. Latches L1 and L2 are clocked by two respective non-overlapping clocks. Latch L3 is clocked by the same clock as L1. This structure doubles the number of latches that switch simultaneously, but allows the latches of levels 2 and higher to switch more slowly.

Similarly, in some embodiments a cell with more than two outputs has more than k latches connected so as to allow the latches of levels 2 and higher to switch more slowly.

The invention also provides P/S converters which include a tree of multi-latch cells and which have similar advantages. The invention provides memories that use P/S and S/P converters for sequential access. The invention provides also memories in which a converter used for sequential access is also used as a Y-decoder for random access.

Other features and advantages of the invention are described below. The invention is defined by the appended claims.

BRIEF DESCRIPTION OF DRAWINGS

The following description makes use of the accompanying drawings, in which.

DESCRIPTION OF PREFERRED EMBODIMENTS

Figure 1:
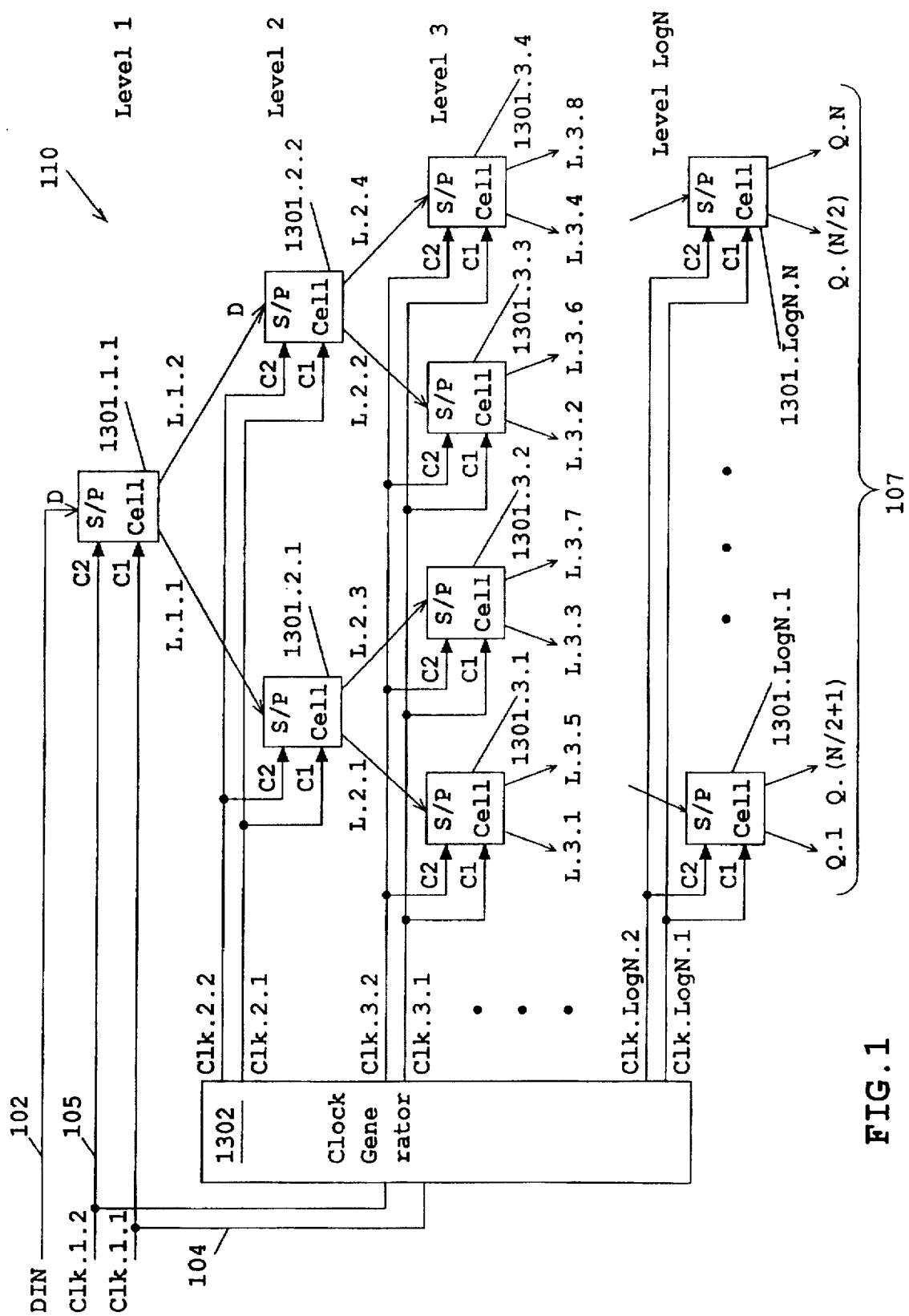
FIG. 1 is a block diagram of an S/P converter according to the present invention.

FIG. 1 is a block diagram of P-register (pyramid-register) S/P converter 110. P-register 110 converts serial data on input 102 (labelled also "DIN") to N-bit words ($Q_1, \ldots Q_N$) that are provided in parallel on N-line output 107. In FIG. 1, the word length N is an integer power of 2.

S/P converter 110 includes S/P cells 1301.i.j connected as a pyramid, i.e., a tree. Each cell 1301.i.j has a block diagram of FIG. 2. In particular, each cell 1301 has a data input D, clock inputs C1, C2, and data outputs q1, q2. Data input D is connected to data inputs DL of latches 210.1, 210.2. The outputs of latches 210.1, 210.2 are respective outputs q1, q2 of cell 1301.

Each latch 210.i includes a clock input CL connected to the respective clock input Ci (C1 or C2) of cell 1301. Clock input CL of latch 210.i controls respective switch 220.i interconnecting the latch's data input DL and the data input DM of respective memory cell 230.i. When clock input CL is high, switch 220.i is closed. When clock input CL is low, switch 220.i is open.

Clock input CL is connected also to clock input CM of memory cell 230.i. The output qM of memory cell 230.i is the latch output qi (q1 or q2).

Figure 3:
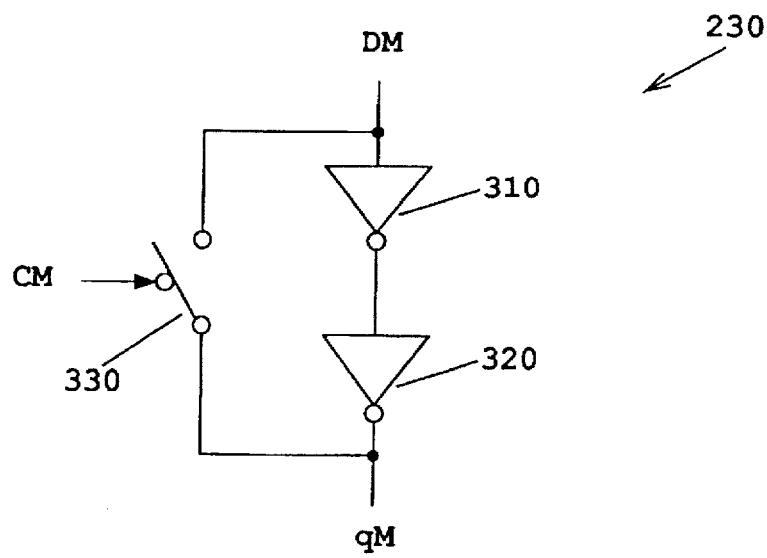
FIG. 3 is a circuit diagram of a memory cell used in some embodiments of S/P and P/S converters of the present invention.

Each memory cell 230.i has the structure of FIG. 3. The input DM of the memory cell is connected to output qM through inverters 310, 320. Output qM is connected to input DM through feedback switch 330. When clock input CM is low, switch 330 is closed. When clock input CM is high, switch 330 is open.

Latches such as latches 210 are described in N. H. E. Weste, K. Eshraghian, "Principles of CMOS VLSI Design: A Systems Perspective" (2nd ed. 1993), pages 19–20 hereby incorporated herein by reference.

S/P converter 110 includes, at each level i, $2^{i-1}$ cells 1301.i.j, j=1, ..., $2^{i-1}$. The level number i varies from 1 to LogN=Log$_2$N. Input D of cell 1301.1.1 is connected to the input DIN of converter 110. Input D of each cell of level i>1 is connected to an output q1 or q2 of a cell of level i−1. More particularly, for each level i=1, ..., LogN−1, the outputs q1, q2 of cell 1301.i.j are connected to respective inputs D of cells 1301.i+1.2j−1, 1301.i+1.2j. The outputs of the level LogN cells 1301.LogN.j are the outputs $Q_1$, ..., $Q_N$ of S/P converter 110.

The clock inputs C1, C2 of cell 1301.1.1 are connected to respective lines 104, 105 providing respective non-overlapping, two-phase clocks Clk.q1.1, Clk.1.2. Lines 104, 105 are also connected to inputs of clock generator 1302 which generates, for each level i>1, a pair of non-overlapping, two-phase clocks Clk.i.1, Clk.i.2. When any one of the two clocks Clk.i.1, Clk.i.2 is at 1 or in a transition between 0 and 1, the other one of the two clocks is at 0. Clock Clk.i.1 is connected to input C1 of each cell 1301.i.j of level i. Clock Clk.i.2 is connected to input C2 of each cell 1301.i.j of level i. Clocks Clk.i.1, Clk.i.2 of any given level i have the same frequency. For each level i>1, this frequency is one-half of the frequency of the clocks of level i−1. Clock generator 1302 includes frequency dividers that generate clocks Clk.i.j from clocks Clk.1.1, Clk.1.2 using techniques known in the art.

Figure 4:
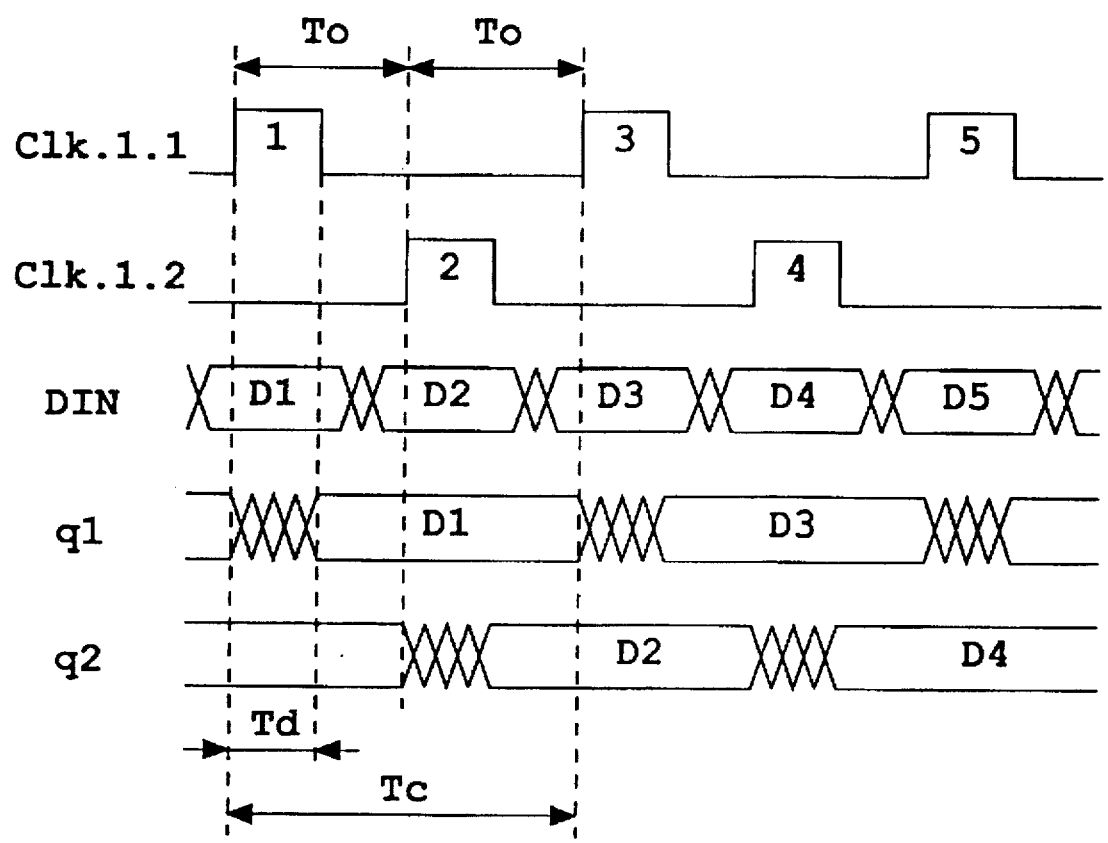
FIG. 4 is a timing diagram for an S/P cell of the converter of FIG. 1.

FIG. 4 is a timing diagram for cell 1301.1.1. Each other cell 1301.i.j has similar timing.

In FIG. 4, the serial input data bits on input DIN are shown as D1, D2, D3, D4, D5 .... The numbers 1, 2, 3, 4, 5 inside the pulses of clocks Clk.1.j indicate the data bits that are clocked by the pulses to the cell output q1 or q2. Thus, on pulse 1, the data bit D1 is read by latch 210.1 from input DIN and provided to output q1. On pulse 2, the data bit D2 is read by latch 210.2 and provided to output q2.

On each rising edge of clock Clk.1.1, latch 210.1 opens and drives the output q1 with a respective data bit Dj, where j is an odd number. On the next falling edge of clock Clk.1.1, latch 210.1 closes and continues to drive the data bit Dj on output q1 independently of any changes of the signal on input DIN.

On the next rising edge of clock Clk.1.2, latch 210.2 opens and drives on output q2 a data bit Dj where j is an even number. On the next falling edge of clock Clk.1.2, latch 210.2 closes and continues to drive the output q2 with the latched data bit Dj. Such operation continues indefinitely.

As is clear from FIG. 4, a single cell 1301 provides an S/P converter for the word length N=2. For N=2, the converter does not need a clock generator 1302.

The period "To" of serial data on input DIN equals the time between the adjacent rising edges of clocks Clk.1.1, Clk.1.2. The pulse width Td of each clock Clk.1.j is large enough to allow the output of respective latch 210.j to settle at the value of the input DIN. In some embodiments, the pulse width Td is made fairly small, not larger than needed to allow the latch output to settle. This is done to increase the time intervals when both clocks Clk.1.j are 0. When both clocks Clk.1.j are 0, transitions on input DIN do not affect the cell outputs q1, q2; outputs q1, q2 are therefore stable and can be latched by the next level cells 1301.2.j or, if N=2, by devices (not shown) connected to the converter output.

Each cell 1301.i.j operates similarly and converts the serial data on its input to two-bit parallel output. If the input of cell 1301.i.j receives an M-bit word in serial form, then the output q1 of cell 1301.i.j yields a serial representation of the word consisting of M/2 odd digits of the input word. The output q2 provides serially M/2 even digits of the input word.

The transfer frequency of bits at each output q1, q2 of two-latch cell 1301.i.j is half of the transfer frequency of serial data at the input D of the cell. Indeed, FIG. 4 shows that if the transfer period of the input data {D1, D2, D3, ...} is To, then the period of input data on each output q1, q2 is 2*To.

The data subsequence on any one of outputs q1, q2 can be converted to the parallel form by another S/P converter, not necessarily of a P-register type. Thus, in some embodiments, two S/P converters of codes of the length N/2 are connected to respective outputs q1, q2 of S/P cell 1301.1.1 to provide an S/P converter of a code of length N. In FIG. 1, each of the two S/P converters of N/2-length codes is a P-register. In some embodiments, one or more cells 1301 are each an S/P converter of a non-P-register type, or a multi-level P-register converter.

In FIG. 1, a subtree of cells 1301 of levels 1 through k, where k is any integer less than LogN, provides an S/P converter for words of length $2^k$. The outputs of this converter, which are the outputs q1, q2 of cells 1301.k.j for all j, will be denoted herein by L.k.1, L.k.2, ..., L.k. $2^k$. When the input DIN on line 102 receives $2^k$ data bits D1, D2, ... in that order, each output L.k.j provides the data bit Dj. When k=LogN, L.LogN.j=$Q_j$.

Figure 5:
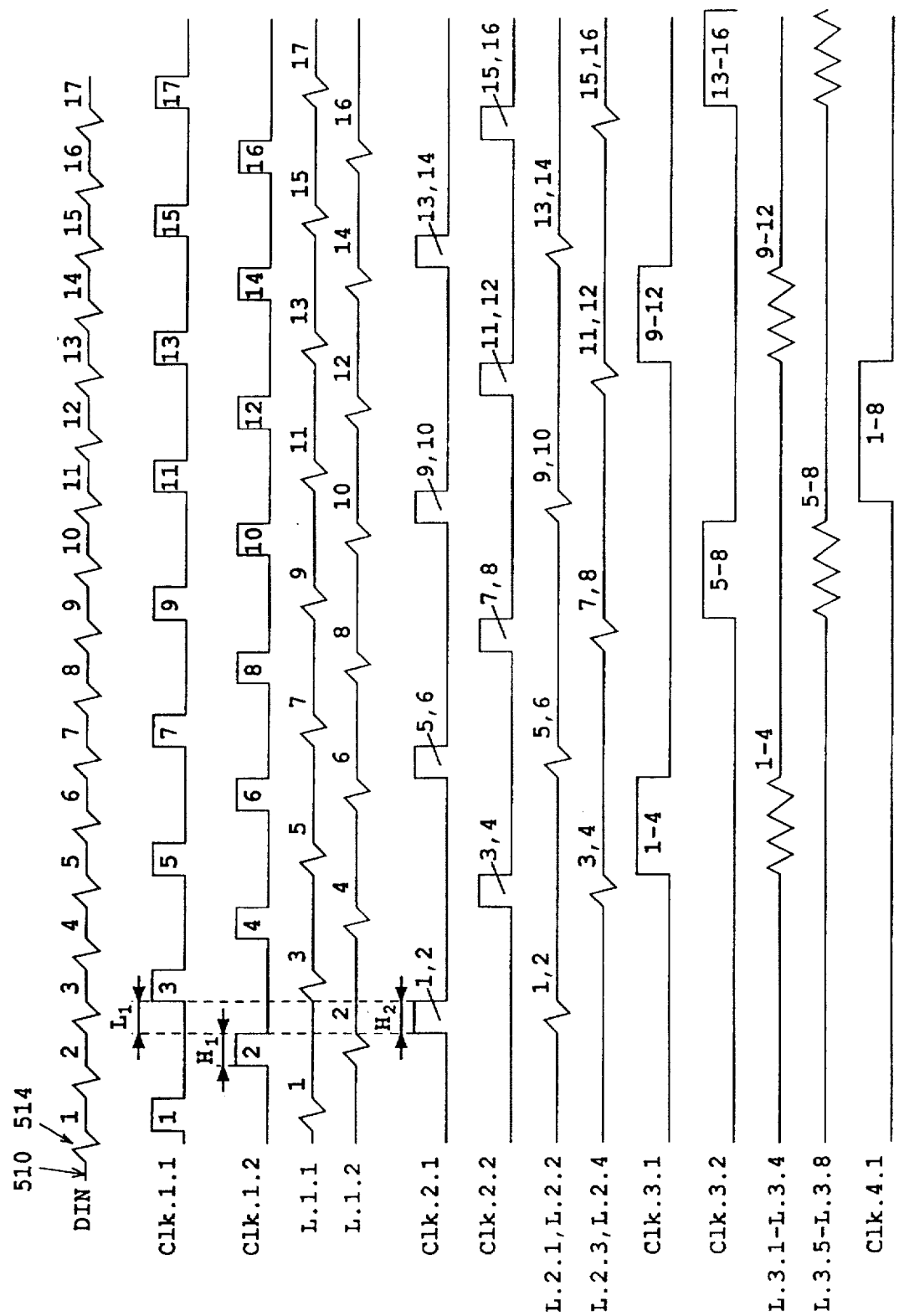
FIGS. 5 and 6 are timing diagrams for the converter of FIG. 1.

FIG. 5 illustrates the timing for S/P converter 110. In the diagram of data signal DIN, the horizontal portions such as 510 illustrate a stable value of the signal. The non-horizontal portions such as 514 illustrate a transition of the signal. Similar techniques are used to illustrate the signals L.i.j.

Input signal DIN and clock signals Clk.1.1, Clk.1.2 are similar to those of FIG. 4. The diagrams in FIG. 5 for signals L.1.1, L.1.2 are similar to the respective diagrams for signals q1, q2 in FIG. 4. In the DIN diagram, numbers above the horizontal segments denote bit numbers in the DIN serial data stream. Thus, numbers 1, 2, 3, 4, 5 ... are used in FIG. 5 instead of D1, D2, D3, D4, D5 in FIG. 4. The numbers above the horizontal segments in the diagrams of signals L.i.j indicate the bit numbers as the bits appear on outputs L.i.j.

On the falling edge of pulse 2 of clock Clk.1.2 (the pulse that causes the bit 2 to be transferred to output q2 of cell 1301.1.1), bits 1, 2 have been stored by respective latches 210.1, 210.2 of cell 1301.1.1. Bit 1 is driven on output L.i.1 and bit 2 on output L.1.2. Clock Clk.2.1 becomes high (pulse "1,2") and causes latches 210.1 of cells 1301.2.1, 1301.2.2 to read the respective bits 1, 2 from respective outputs L.i.1, L.1.2. This pulse of clock Clk.2.1 is marked as "1,2" to indicate the numbers of bits that this pulse clocks through. Clock Clk.2.1 becomes low at or before the rising edge of pulse 3 of clock Clk.1.1. Hence, latches 210.1 of cells 1301.2.1, 1031.2.2 become closed before bit 3 appears on output L.i.1. Latches 210.1 of cells 1301.2.j drive on their respective outputs L.2.1, L.2.2 the respective bits 1, 2 as bit 3 is read by cell 1301.1.1. Numbers "1,2" in the diagram for outputs L.2.1, L.2.2 indicate the values of these outputs.

At the falling edge of pulse 4 of clock Clk.1.2, bits 3 and 4 have been stored by respective latches 210.1, 210.2 of cell 1301.1.1. Clock Clk.2.2 becomes high (pulse "3,4"). Latches 210.2 of cells 1302.2.1, 1302.2.2 read the respective bits 3, 4 and provide them on the respective outputs L.2.3, L.2.4.

After the falling edge of pulse "3,4" of clock Clk.2.2 and until the rising edge of pulse "5,6" of clock Clk.2.1, the outputs L.2.1 through L.2.4 are stable providing the respective bits 1–4. Clock Clk.3.1 becomes high (pulse "1–4") to latch these bits into the latches 210.1 of respective cells 1301.3.j, j=1, 2, 3, 4. Clock Clk.3.1 becomes low at or before the rising edge of pulse "5,6" of clock Clk.2.1.

After the falling edge of pulse "7,8" of clock Clk.2.2, clock Clk.3.2 becomes high. Bits 5–8 are read by latches 210.2 of respective cells 1301.3.j. Clock Clk.3.2 becomes low at or before the rising edge of pulse "9,10" of clock Clk.2.1.

Between the 5–8 pulse of clock Clk.3.2 and the 9–12 pulse of clock Clk.3.1, clock Clk.4.1 becomes high allowing the latches 210.1 of the fourth level cells 1301.4.j to read bits 1–8. Such operation continues indefinitely. The input bits gradually propagate to lines $Q_i$ of output 107.

As explained above, the frequency of the signals on output q1, q2 of any cell 1301 is one-half the frequency on the cell input D. Therefore, the frequency on output $Q_i$ of converter 110 is 1/N of the frequency on the converter input DIN. Hence, at a given frequency of the serial input data the converter throughput is as high as that of a serial-in, parallel-out shift register described, for example, in J. F. Wakerly, "Digital Design: Principles & Practices" (2nd ed. 1994), at page 607 hereby incorporated herein by reference.

However, the number of simultaneously switching elements in some embodiments of converter 110 is twice smaller than the number of simultaneously switching elements in a shift register having the same number N of parallel outputs. Indeed, each latch 210.j (FIG. 2) switches its state only on the rising edge of the clock input Cj of the latch. Hence, at each level i, at most half of the latches switch simultaneously. In some embodiments, the latches at different levels do not switch simultaneously because the rising edges of the clocks Clk.i.j at different levels i do not coincide. In FIG. 5, the rising edge of pulse 1–4 of clock Clk.3.1 is shown to coincide in time with the rising edge of pulse 5 of clock Clk.1.1. However, in some embodiments pulse 1–4 of clock Clk.3.1 is delayed from the rising edge of pulse 5. Clocks Clk.i.j are generated using methods known in the art so that the rising edges of clocks at different levels do not coincide.

Hence, the largest number of latches that can switch states simultaneously is N/2, that is, one-half of the number of latches of level LogN. By contrast, in a shift-register S/P converter for words of the same length N, N latches can switch simultaneously. Thus, in converter 110, the peak transient current is low.

The total number of latches in S/P converter 110 is 2N–2 versus 2N latches in a shift register. Reducing the number of latches reduces further the peak transient current and the power consumption.

The peak transient current and the power consumption are reduced further in some embodiments in which the cells 1301 of higher-numbered levels are made slower. In FIG. 5, the pulse width of clocks Clk.3.1, Clk.3.2 is greater than the pulse width of clocks Clk.1.1, Clk.1.2. Hence, latches 210 of level 3 have more time to read data than latches 210 of level 1. Therefore, the latches of level 3 and of higher-numbered levels can be made slower.

More particularly, in cell 1301.1.1 a latch 210 reads a data bit in the time that the bit appears on input DIN. Accordingly, in some embodiments clock Clk.1.1 or Clk.1.2 is high when input DIN is stable, and both clocks Clk.1.j are low during a transition on input DIN. Such an embodiment is shown in FIG. 5. Similarly, a latch 210 of cell 1301.2.j reads a data bit in the time that the bit appears on respective output L.1.k. Accordingly, in some embodiments including the embodiment of FIG. 5, clock Clk.2.1 or Clk.2.2 is high only when both outputs L.i.1, L.1.2 are stable. Both outputs L.1.j are stable when both clocks Clk.1.j are low, that is, when input DIN undergoes a transition. Accordingly, in some embodiments clock Clk.2.1 or Clk.2.2 is high only when input DIN is in a transition. In some embodiments, the transition time of input DIN is about equal to the time that input DIN is stable. Hence, in some embodiments the pulse width of clocks Clk.2.j is about equal to the pulse width of clocks Clk.1.j, and the latches of level 2 are as fast as the latches of level 1. However, since the period of clocks Clk.i.j doubles at every level as the level number increases, latches of levels 3 and higher can be made slower, as illustrated by the longer pulse widths of clocks Clk.3.j and Clk.4.j in FIG. 5. Making the latches slower reduces the peak transient current and the power consumption.

The relationship between the speed of latches at different levels in FIG. 5 is illustrated by the formulas (1)–(4) below. In FIG. 5, for each i>1, the clock Clk.i.1 or Clk.i.2 is high when both clocks CLK.i-1.1, Clk.i-1.2 are low. For each i, clocks Clk.i.1, Clk.i.2 are low during a transition on any input of any S/P cell of level i. In formulas (1)–(4), $H_i$ denotes the pulse width of clock Clk.i.j. Thus, $H_1$=Td (FIG. 4). $L_i$ denotes the time interval when both clocks of level i are low, that is, the time between the falling edge of one of the clocks and the rising edge of the other one of the clocks. In FIG. 5 the time between the falling edge of clock Clk.i.1 and the rising edge of clock Clk.i.2 is the same as the time between the falling edge of clock Clk.i.2 and the rising edge of clock Clk.i.1 and is equal to $L_i$. $T_i$ denotes the period of clock Clk.i.j of level i. Thus, $T_1$=Tc (FIG. 4). Then, as illustrated by FIG. 5:

$$T_i = 2H_i + 2L_i \tag{1}$$

$$H_{i+1} = L_i \tag{2}$$

$$T_{i+1} = 2T_i = 2H_{i+1} + 2L_{i+1}. \tag{3}$$

Hence, $$L_{i+1} = T_i - L_i = 2H_i + L_i \tag{4}$$

The last equality shows that $L_{i+1}$ is greater than $L_i$, significantly greater in some embodiments. Hence (see formula (2)), $H_{i+2}$ is larger than $H_{i+1}$. Therefore, starting with level i=3 the pulse width $H_i$ increases. In this example, the pulse width $H_i$ is equal to the time given to the latches of level i to read one bit. Since $H_i$ increases, the latches at each level i≦3 can be made slower than at the previous level.

In some embodiments, the pulse width $H_{i+1}$ is made smaller than $L_i$ for some i in order to make $L_{i+1}$ larger.

Making $L_{i+1}$ larger allows increasing $H_{i+2}$. In some such embodiments, $H_{i+1}=2H_i$ for all $i \leq 2$. Therefore, the latches at each level starting with level 3 can be made twice slower than at the previous level.

Figure 6:
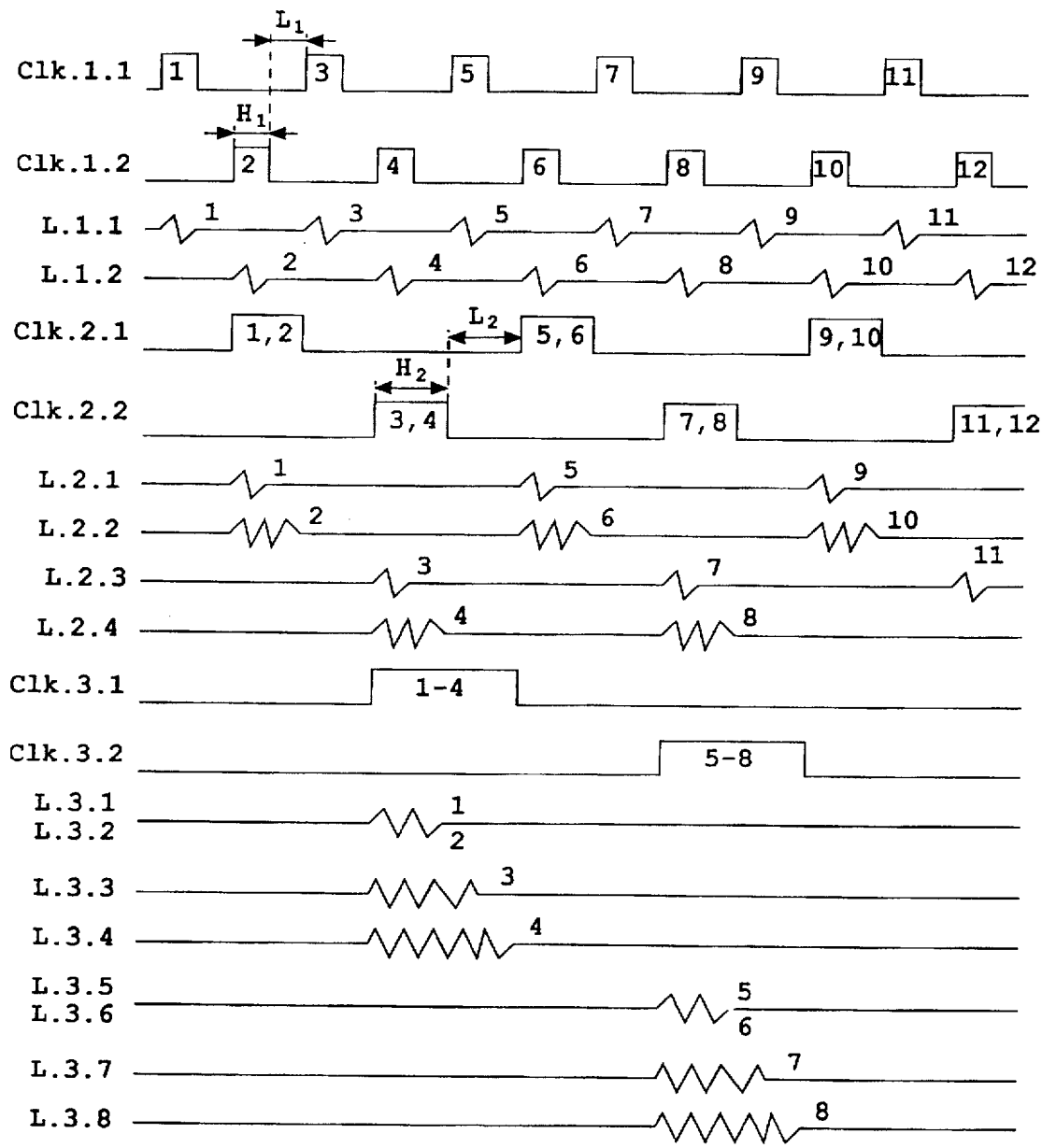

FIG. 6 illustrates the timing for another embodiment of converter 110. In this embodiment, the pulses of clocks Clk.2.j start earlier than in FIG. 5 and overlap with respective pulses of clock Clk.1.2. For example, pulse "1.2" of Clk.2.1 overlaps with pulse 2 of Clk.1.2. Similarly, the pulses of clocks Clk.3.j overlap with the respective pulses of clock Clk.2.2, and so on for subsequent levels. In FIG. 6, each pulse of clock Clk.2.j is shown to start at the same time as a corresponding pulse of clock Clk.1.2. In some embodiments, the pulses of clock Clk.2.j are delayed to reduce the peak transient current.

In FIG. 6, $H_{i+1}=2H_i$ for all i. Since formulas (1), (3) apply to FIG. 6, the time $L_{i+1}=2L_i$ for all i. Since $L_i$ in FIG. 6 is the time when latches 210 of level i+1 can read stable data, latches 210 of each level starting with level 3 can be twice slower than latches 210 of the previous level.

Because pulse "1.2" of clock Clk.2.1 starts before the falling edge of pulse 2 of clock Clk.1.2, latches 210 of second level cell 1301.2.1 have more time to read the respective bits and, in some embodiments, are slower, than latches 210 of cell 1301.2.2. Similarly, in some embodiments, at all levels starting with the second the latches of cells 1301.i.j with j odd are slower than the latches 210 of the same level cells 1301.i.j with j even. The peak transient current and the power consumption are reduced as a result.

Figure 7:
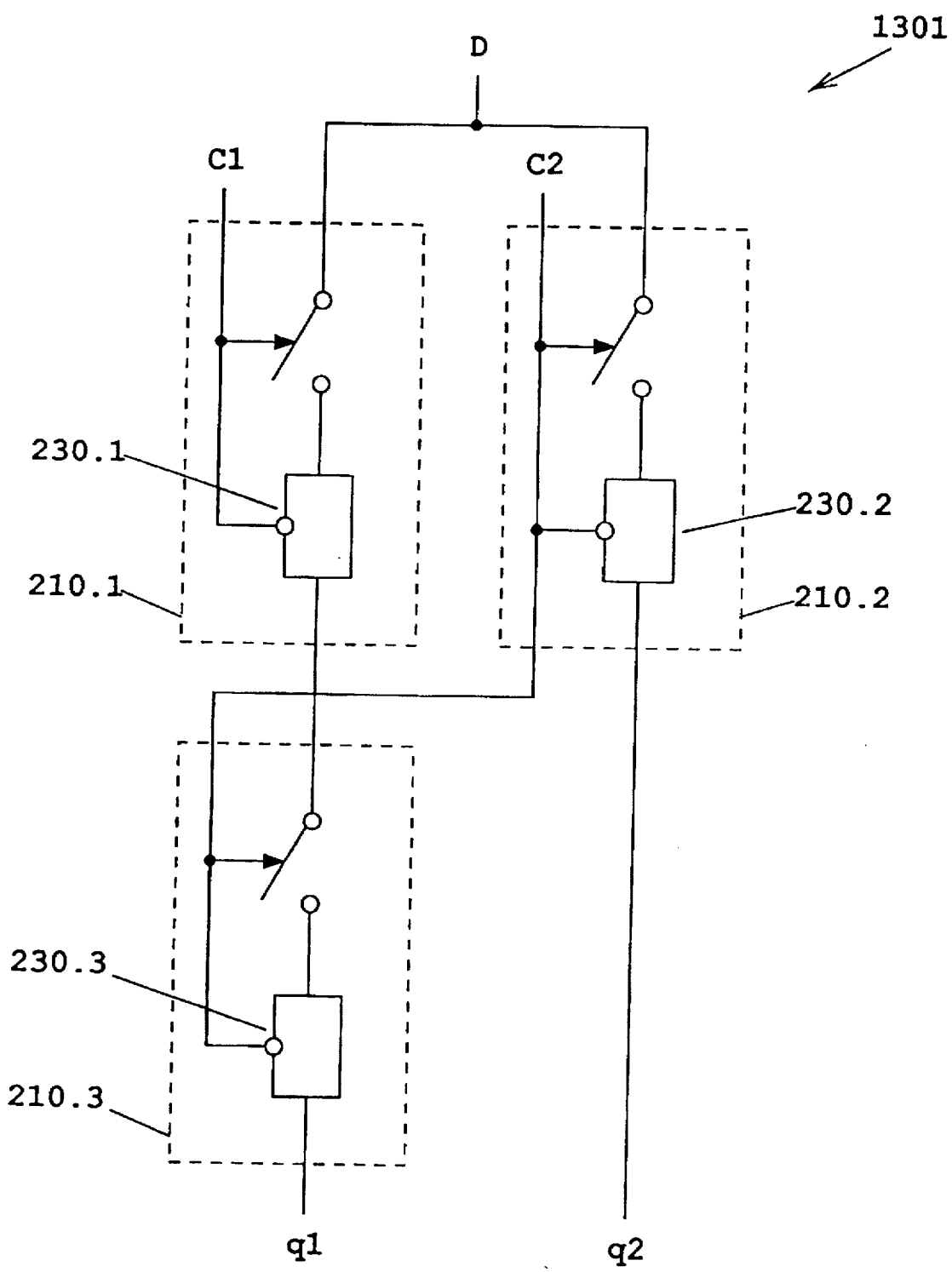
FIG. 7 is a diagram of an S/P cell used in some embodiments of the converter of FIG. 1.

FIG. 7 illustrates another embodiment of cell 1301 that includes a latch 210.3 between the output of latch 210.1 and the output q1 of cell 1301. Latch 210.3 is clocked by clock C2. Latch 210.3 has the same diagram as latches 210 of FIG. 2. Clock input C1 is connected to the clock input of latch 210.1. Clock input C2 is connected to the clock inputs of latches 210.2, 210.3.

Figure 2:
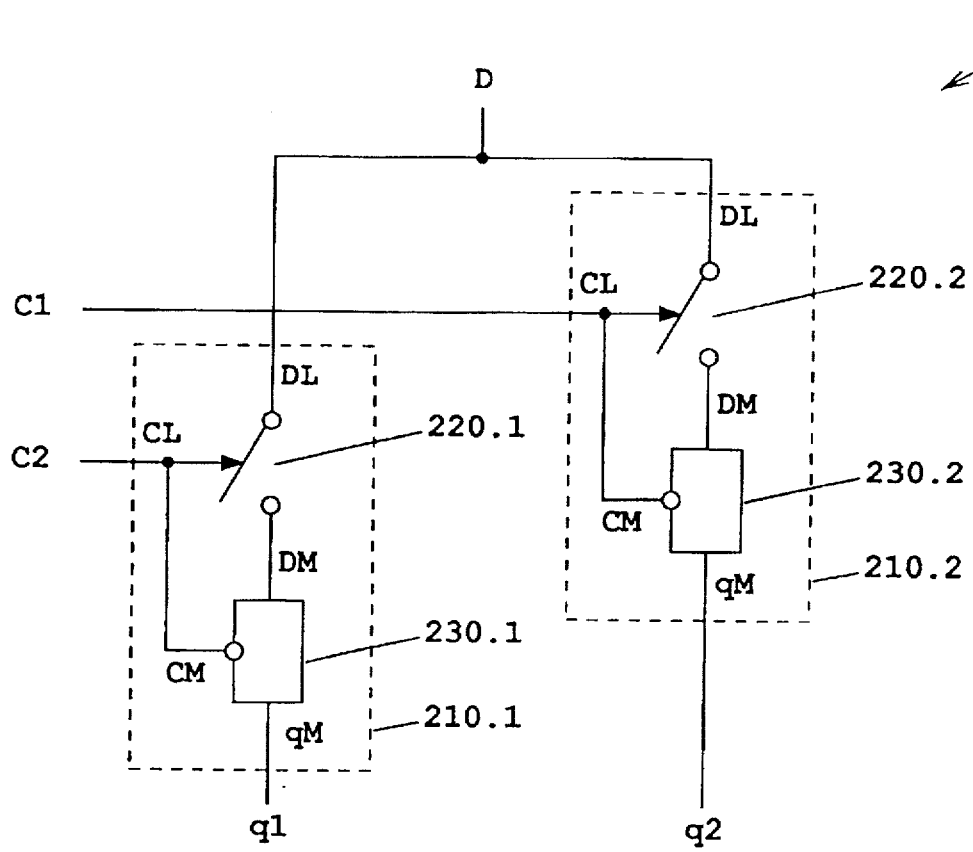
FIG. 2 is a diagram of an S/P cell used in some embodiments of the converter of FIG. 1.
Figure 8:
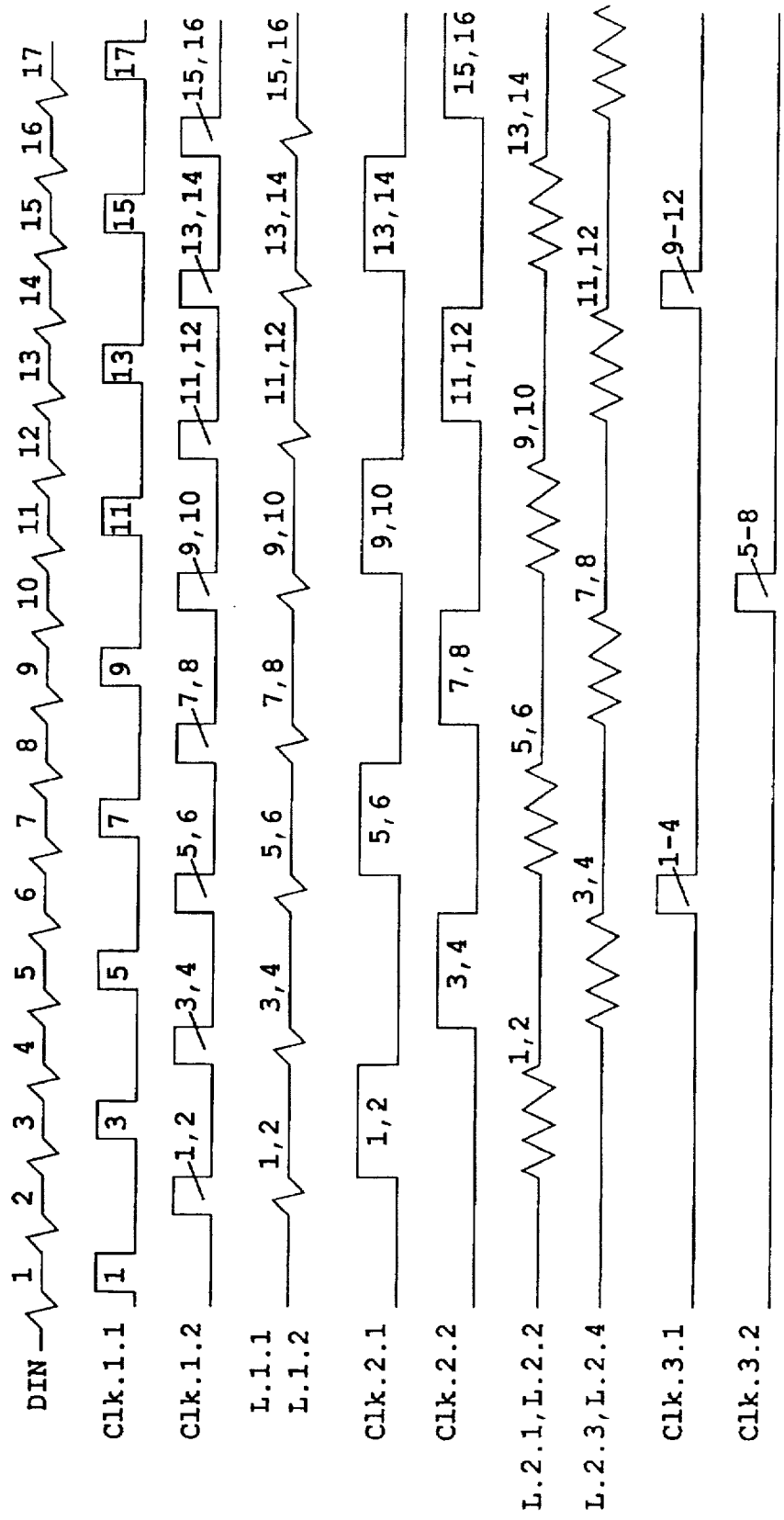
FIGS. 8, 9A and 9B are timing diagrams for the converter of FIG. 1 with an S/P cell of FIG. 7.

FIG. 8 shows the timing for converter 110 in which the cell 1301.1.1 has the diagram of FIG. 7 and the remaining cells 1301 have the diagram of FIG. 2. Signals DIN, Clk.1.1, Clk.1.2, L.1.2 are similar to those of FIG. 5. However, the timing of output L.1.1 is different from FIG. 5 and coincides with the timing of output L.1.2. This is because latch 210.3 driving the output L.1.1 is clocked by the same clock Clk.1.2 as latch 210.2 driving the output L.1.2. Since the time intervals of stability of outputs L.1.1, L.1.2 coincide, more time is allowed for both outputs to be read by the second level cells 1301. This is illustrated by longer pulses of clocks Clk.2.j in FIG. 8 and by longer transitions of outputs L.2.j. However, the time intervals of stability of outputs L.2.1, L.2.3 do not coincide. Therefore, at least some latches 210 of level 3 are given in some embodiments less than the full stability period of a single output L.2.j to read one data bit.

Of note, the faster the latches 210 of level 2, the longer are the time intervals during which the outputs L.2.j are stable, and hence the slower the latches of levels 3 and higher are allowed to be.

Figure 9A:
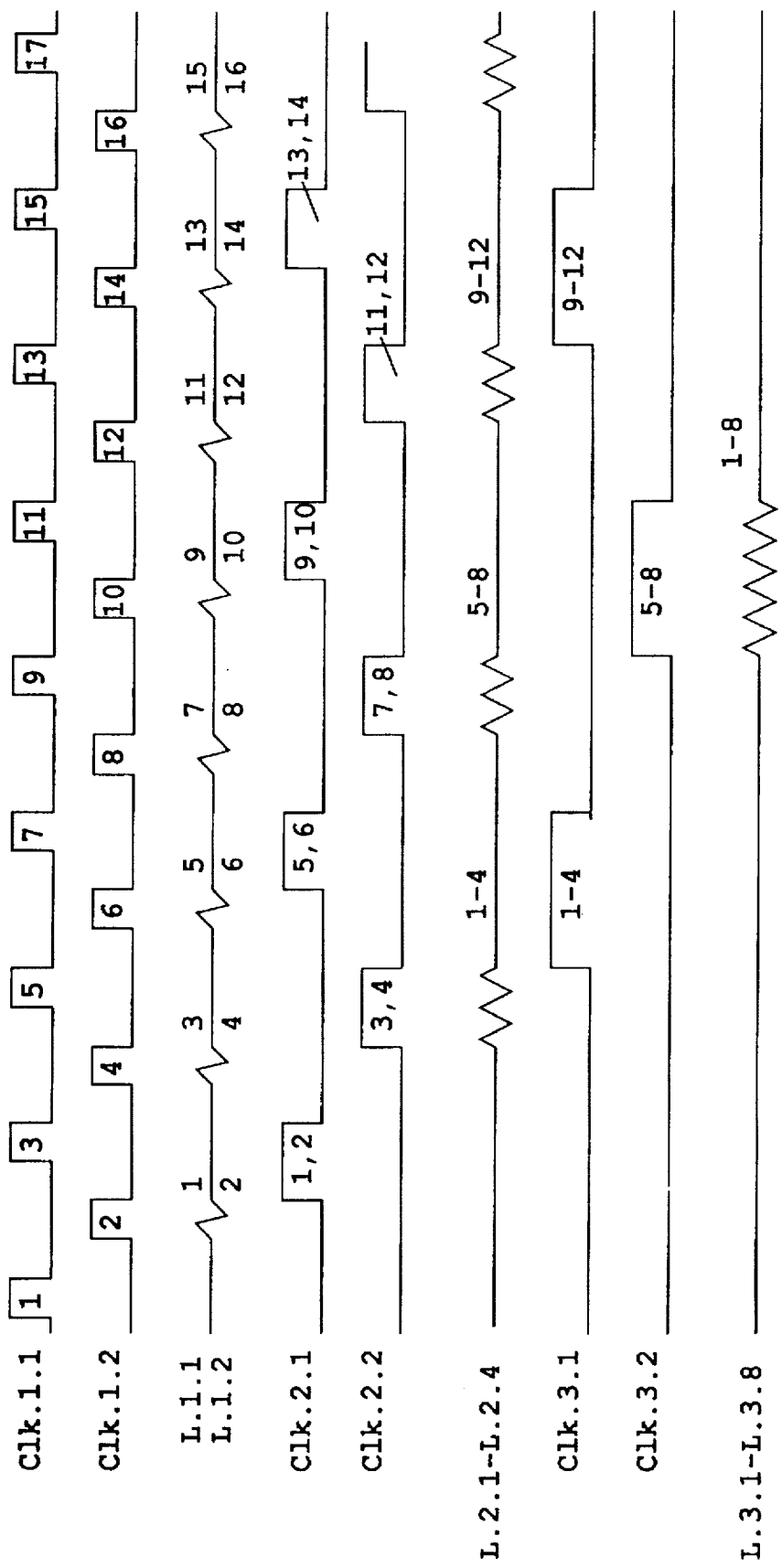

FIG. 9A illustrates the timing for a converter 110 in which all the cells 1301 have the structure of FIG. 7. For each level i, all the outputs L.i.j have the same timing determined by the clock Clk.i.2. Hence the stability periods of all the signals L.i.j coincide for each given i, allowing the latches of the next level i+1 to be slower.

With the cells of FIG. 7, for any given level i the time that the outputs L.i.j are stable is greater than or equal to the time that the clock Clk.i.2 is low. In FIG. 9A, for all i<LogN, $H_{i+1}=2H_i$ and the clock pulses at level i+1 do not overlap with the pulses of clock Clk.i.2. Hence, the latches at each level starting with level 2 can be made twice slower than at the previous level.

Figure 9B:
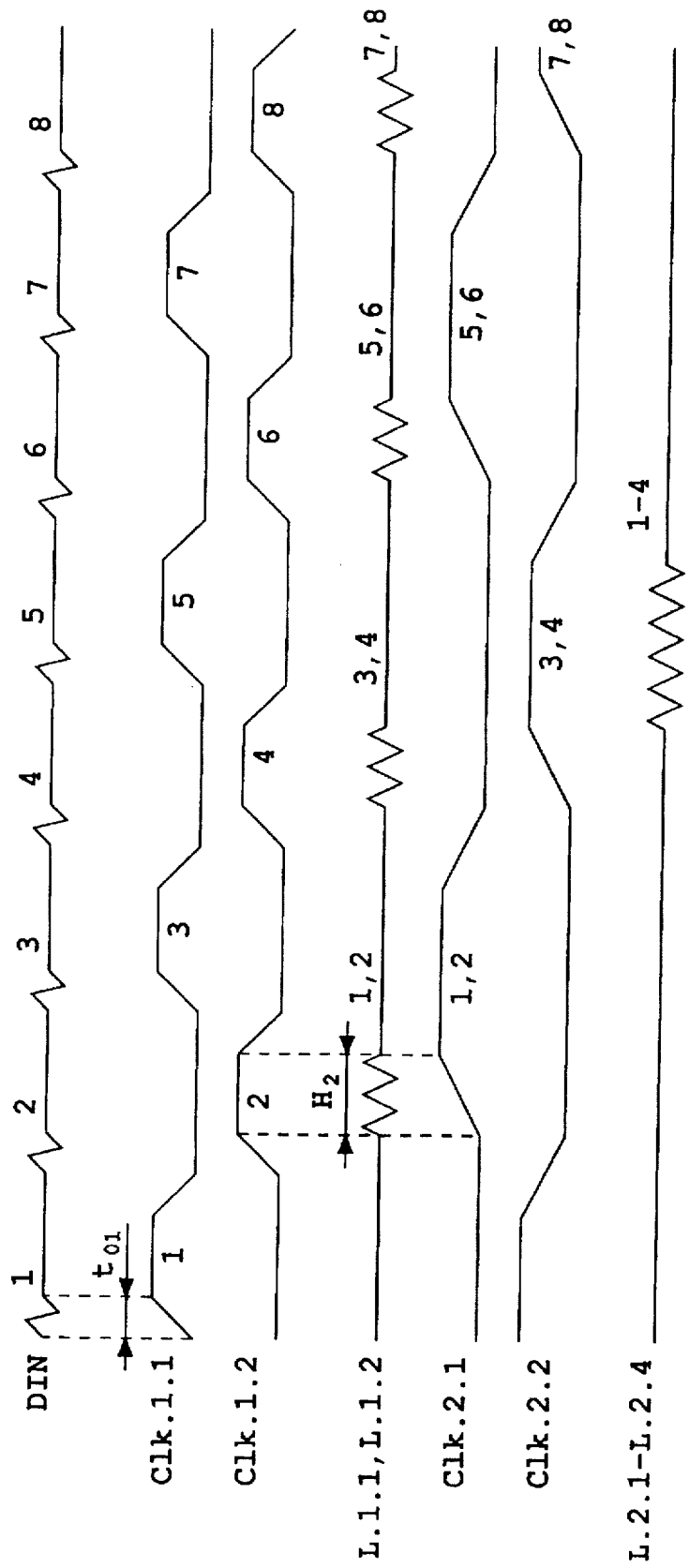

FIG. 9B is similar to FIG. 9A. In FIG. 9B, the clock transition times are shown as positive, and the transition time of each clock Clk.i.j of level i>1 is twice longer than the transition time of each clock Clk.i−1.j of the previous level. Each zero-to-one transition of each clock Clk.1.j coincides with a transition of the serial data input DIN, and the transition time $t_{0_1}$ of each clock of level 1 is equal to the transition time of signal DIN.

The time $H_i$ that a level i clock Clk.i.j stays at its high rail value coincides with the transition time of signals L.i.j. The transitions of signals L.i.j occur when Clk.i.2=1.

If all the cells 1301 at level LogN have the structure of FIG. 7, the number of latches that switch states simultaneously can reach N. However, making the latches slower reduces the peak transient current and the power consumption. Moreover, the latches of level LogN operate at the frequency of only 1/Nth of the frequency of input data DIN. Hence the rate of change of the current at level LogN reaches its peak value at the lower frequency, increasing the S/P converter reliability (i.e. decreasing the converter error rate).

Some embodiments use different clock pairs to clock different cells of the same level, allowing latches 210 to be slower. For example, in some embodiments, one clock pair clocks the cell 1301.2.1, and a different clock pair of the same frequency clocks the cell 1301.2.2. All the four clocks of level 2 are generated by clock generator 1302. In some such embodiments, clock pulses at input C2 of one of the two cells of level 2 overlap with clock pulses at input C1 of the other cell, allowing each cell more time to read data.

Figure 10:
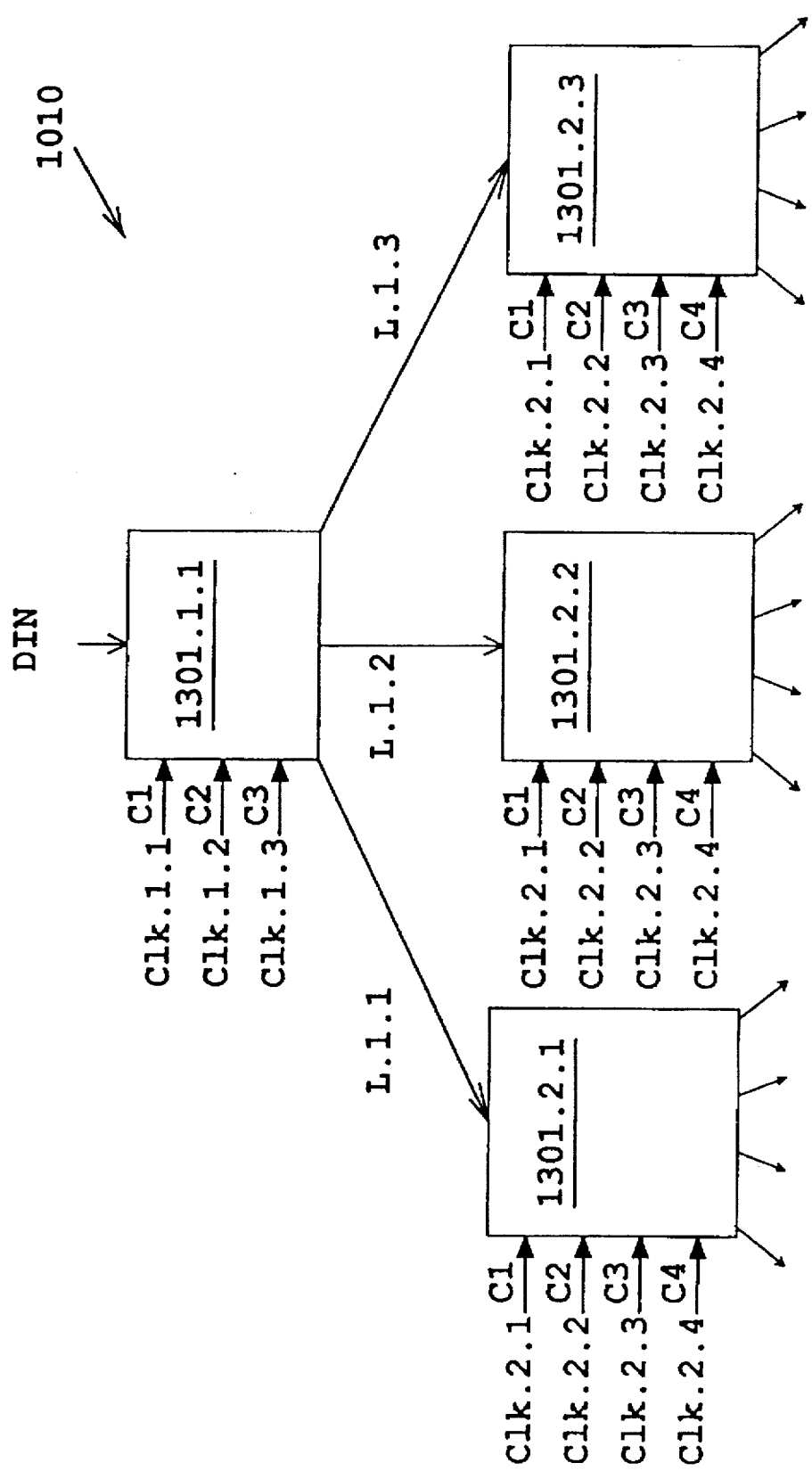
FIG. 10 is a block diagram of another S/P converter according to the present invention.

In S/P converter 1010 of FIG. 10, S/P cell 1301.1.1 of level 1 splits the serial input data stream DIN into three serial streams. Input bits 1, 4, 7 . . . appear on the cell's output L.1.1. Bits 2, 5, 8 . . . appear on the cell's output L.1.2. Bits 3, 6, 9 . . . appear on the cell's output L.1.3. The cell's clock inputs C1, C2, C3 receive three respective non-overlapping clocks Clk.1.1, Clk.1.2, Clk.1.3.

An S/P cell's number of outputs, 3 for cell 1301.1.1 of FIG. 10, is called herein "branching coefficient". Outputs L.1.1, L.1.2, L.1.3 are connected to the inputs of respective cells 1301.2.1, 1301.2.2, 1301.2.3 of tree level 2. Each cell 1301.2.j has a branching coefficient of 4. Some embodiments use cells with higher branching coefficients.

Figure 11:
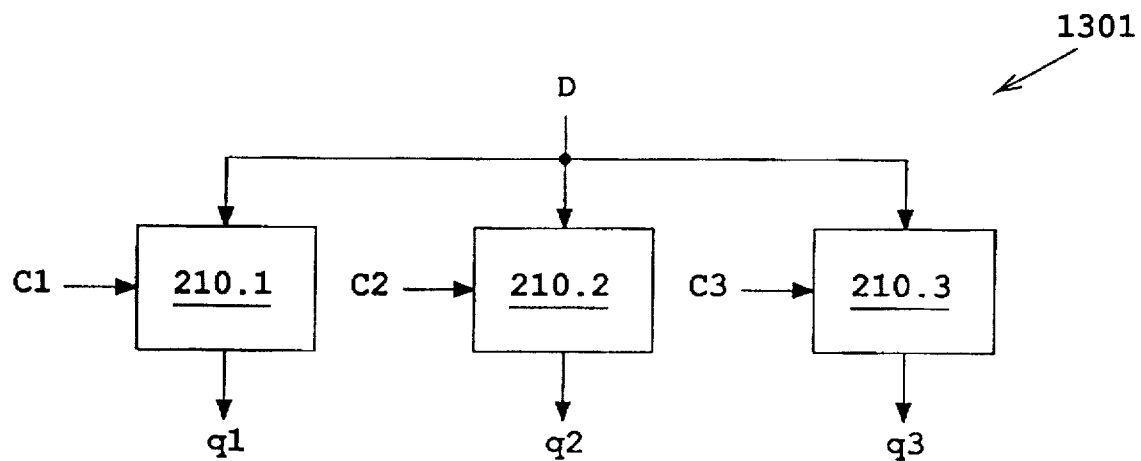
FIGS. 11 and 12 are diagrams of different embodiments of S/P cells used in the converter of FIG. 10.

In some embodiments, different cells of the same level have different branching coefficients. In some embodiments, a cell with a branching coefficient k>2 includes k latches with inputs connected to the cell's input and with outputs providing the cell's k outputs. A k=3 embodiment of such a cell is shown in FIG. 11. Each latch 210.j of FIG. 11 has the same structure as in FIG. 2 and is clocked by separate clock cj (j=1, 2, 3).

Figure 12:
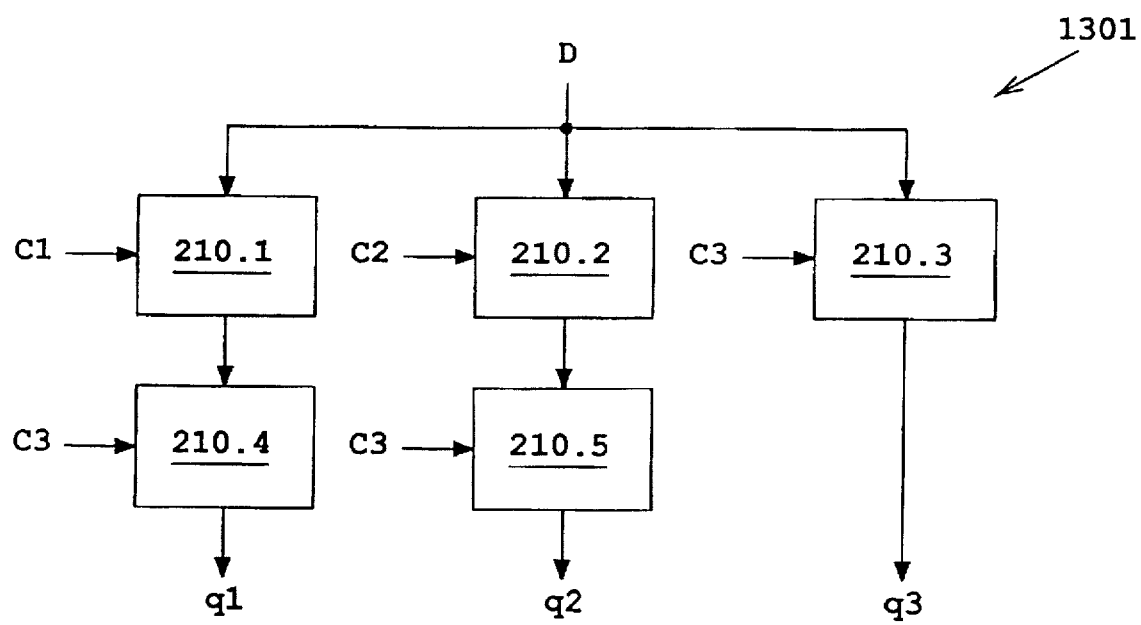

FIG. 12 illustrates an alternate embodiment of a three-output S/P cell 1301. The data inputs of latches 210.1, 210.2, 210.3 are connected to data input D of the cell. Latch 210.4 is connected between the output of latch 210.1 and the S/P cell's output q1. Latch 210.5 is connected between the output of latch 210.2 and output q2. The output of latch 210.3 is the S/P cell's output q3. Latches 210.1, 210.2 are clocked by respective clocks C1, C2. Latches 210.3, 210.4, 210.5 are clocked by clock C3. Outputs q1, q2, q3 have the same transition timing which is determined by clock C3. Hence the stability periods of outputs q1, q2, q3 coincide allowing the devices connected to the outputs to be made slower. See the discussion above in connection with FIGS. 7, 8, 9A and 9B.

Some S/P converter embodiments use cells with a branching coefficient k>3 and a structure similar to that of FIG. 12, with all the outputs of the S/P cell having the same timing.

K-output cells with k>2 facilitate construction of S/P converters for word lengths other than a power of 2. Thus, the 2-level converter of FIG. 10 provides the word length N=12.

Branching coefficients k>2 allow reducing the number of simultaneously switching elements in cells 1301. For example, in a FIG. 10 converter 1010 with cell 1301.1.1 having the structure of FIG. 11 and with cells 1301.2.j having a similar structure, on a rising edge of each clock Clk.2.j, at most one latch in each cell 1301.2.j switches state. Thus, in some FIG. 10 embodiments in which the rising edges of different level clocks do not coincide, at most 3 latches switch states simultaneously. This number 3 is smaller than N/2=6. However, increasing the cell's branching coefficient increases the capacitance of the cell's input node and thus may increase the power needed to charge this capacitance.

Figure 13:
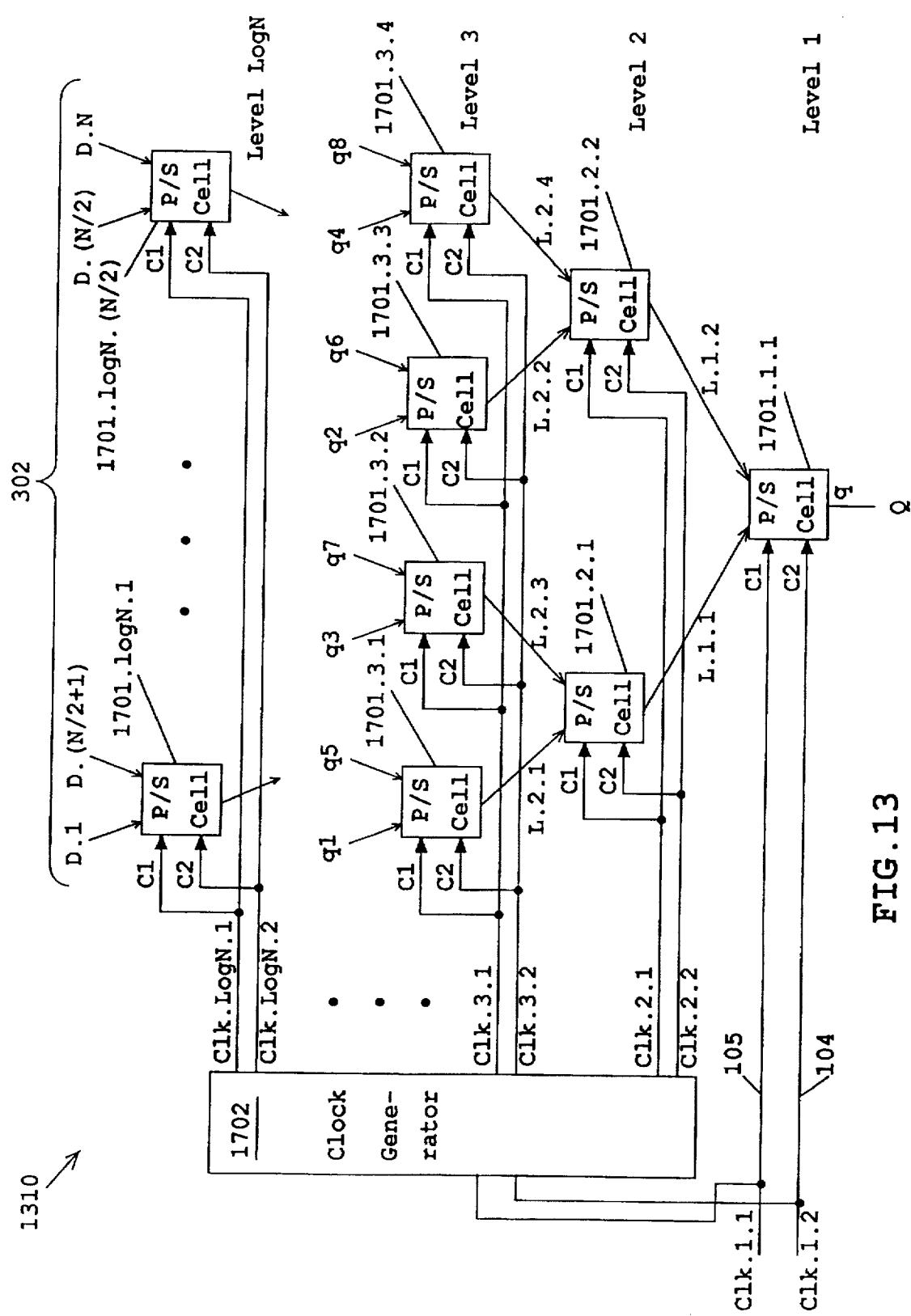
FIG. 13 is a block diagram of a P/S converter according to the present invention.

FIG. 13 is a block diagram of a parallel-to-serial (P/S) P-register converter 1310. P/S converter 1310 converts N-bit parallel data words on input 302 to serial data on output Q. In FIG. 13, the word length N is an integer power of 2.

Figure 14:
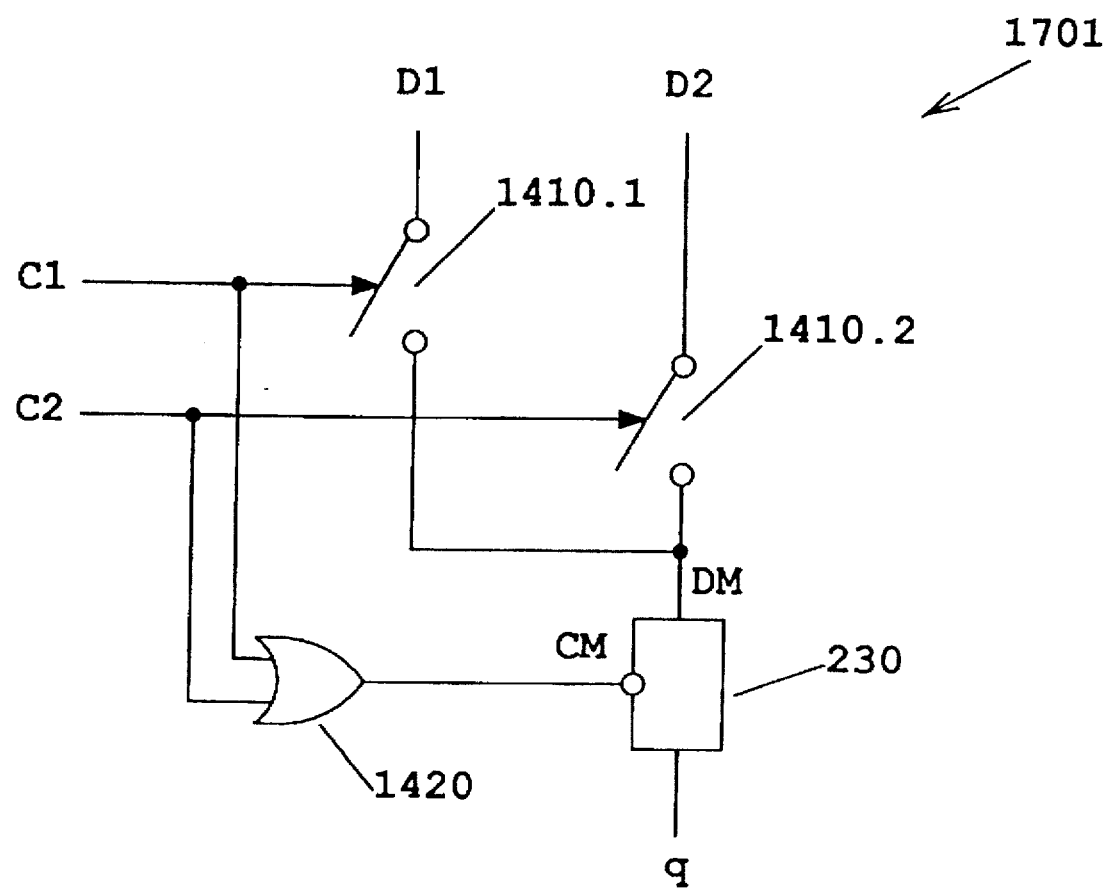
FIG. 14 is a diagram of a P/S cell used in some embodiments of the converter of FIG. 13.

Converter 1310 includes P/S cells 1701.i.j connected as a pyramid, i.e., a tree. Each cell 701.i.j has a block diagram of FIG. 14. In particular, each cell 1701 has data inputs D1, D2, clock inputs C1, C2, and data output q. Data inputs D1, D2 are connected to data input DM of memory cell 230 through respective switches 1410.1, 1410.2. When clock input Ci (C1 or C2) is high, the respective switch 1410.i is closed. When clock input Ci is low, the respective switch 1410.i is open.

Memory cell 230 has the structure of FIG. 3.

Clock inputs C1, C2 are ORed by OR gate 1420 whose output is connected to clock input CM of memory cell 230.

In some embodiments, OR gate 1420 is not provided in every cell 1701 but a single OR gate 1420 is provided for a whole row of cells 1701. In such embodiments, the output of gate 1420 for row i is connected to the input CM of each memory cell 230 of each cell 1701 of row i.

P/S converter 1310 includes, at each level i, $2^{i-1}$ P/S cells 1701.i.j, j=1, ..., $2^{i-1}$. The level number i varies from 1 to LogN. The output q of the bottom cell 1701.1.1 is connected to the output Q of converter 1310. The output q of each P/S cell of level i>1 is connected to an input D1 or D2 of a cell of level i−1. More particularly, for each level i=1, ..., LogN−1, the inputs D1, D2 of cell 1701.i.j are connected to respective outputs q of cells 1701.i+1.2j−1, 1701.i+1.2j. The inputs of the level LogN cells 1701.LogN.j are the inputs D.j of P/S converter 1310.

The clock inputs C1, C2 of cell 1701.1.1 are connected to respective lines 104, 105 providing respective non-overlapping two-phase clocks Clk.1.1, Clk.1.2. Lines 104, 105 are also connected to inputs of clock generator 1702 which generates, for each level i>1, a pair of non-overlapping, two-phase clocks Clk.i.1, Clk.i.2. Clock Clk.i.1 is connected to input C1 of each cell 1701 or level i. Clock Clk.i.2 is connected to input C2 of each cell 1701 of level i. Clocks Clk.i.1, Clk.i.2 of level i have the same frequency. For each level i greater than 1, this frequency is one-half of the frequency of the clocks of level i−1. Clock generator 1702 includes frequency dividers that generate clocks Clk.i.j from clocks Clk.1.1, Clk.1.2 using techniques known in the art.

In FIG. 13, a subtree of cells 1701 of levels 1 through k, where k is any integer less than LogN, provides a P/S converter for words of length 2. The inputs of this converter, which are the data inputs of cells 1701.k.j for all j, will be denoted by L.k.1, L.k.2, ..., L.k.$2^k$. When inputs L.k.j receive respective bits Dj of a 2k-bit word, the output Q provides these bits in the sequence L.k.1, L.k.2, ..., L.k.$2^k$. For k=LogN, L.k.j=D.j.

Figure 15:
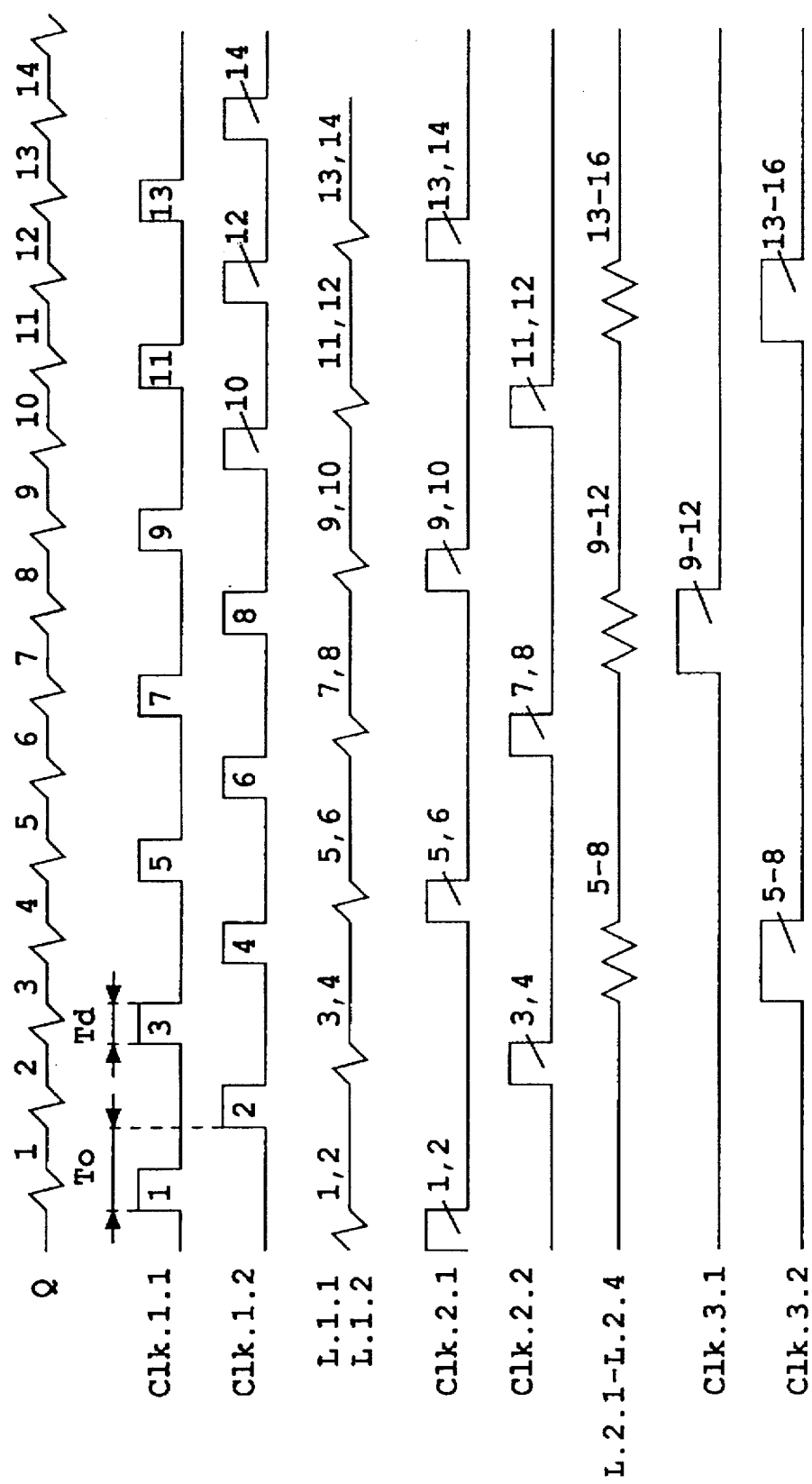
FIG. 15 is a timing diagram for the converter of FIG. 13.

FIG. 15 is a timing diagram for converter 1310. The sequence of the serial data bits on output Q is shown as 1, 2, 3, .... These bits are read from respective inputs L.i.1, L.1.2. Inputs L.1.1, L.1.2 become valid simultaneously before or at the falling edge of pulse "1,2" of clock Clk.2.1. When they become valid, clock Clk.1.1 becomes high (pulse 1) to close the switch 1410.1 of cell 1701.1.1. OR gate 1420 drives a high signal on input DM of memory cell 230 of P/S cell 1701.1.1. Memory cell 230 drives the output q, and hence the converter output Q, with data bit 1 received from input L.1.1.

Clock Clk.1.1 remains high sufficiently long to allow the output Q to settle. Then Clk.1.1 becomes low. Clock Clk.1.2 becomes high (pulse 2) to write the signal on input L.1.2 to output Q. Such operation continues indefinitely.

Thus, a single cell 1701 provides a P/S converter for the word length N=2. For N=2, the converter does not need a clock generator 1702.

The period "T0" of serial data on output Q is the time between the adjacent rising edges of clocks Clk.1.1, Clk.1.2. The pulse width Td of each clock Clk.1.j is large enough to allow the output Q to settle. In some embodiments, the pulse width Td is made very small, not larger than needed to allow the output Q to settle. This is done to increase the time intervals when both clocks Clk. 1.j are 0. When both clocks Clk.1.j are 0, the inputs L.1.j do not affect output Q and can be changed by the next level cells 1701.2.j or, if N=2, by devices (not shown) connected to the input of converter 1310.

Each cell 1701.i.j operates similarly to cell 1701.1.1 and converts two-bit parallel input data to serial output.

In each two-input cell 1701, the transfer frequency at each input D1, D2 is half of the transfer frequency at the cell output q. The data subsequence on any one of inputs D1, D2 of cell 1701 can be provided by another P/S converter, not necessarily of P-register type.

In FIG. 15, on the falling edge of pulse 2 of clock Clk.1.2, clock Clk.2.2 becomes high (pulse "3,4") for a sufficient time to allow the outputs L.1.1, L.1.2 to settle at the respective values of bits 3,4. Outputs L.1.1, L.1.2 settle at or before the rising edge of pulse 3 of clock Clk.1.1. In FIG. 15, the pulse "3,4" of clock Clk.2.2 terminates before, or at the start of, pulse 3 of clock Clk.1.1. In some embodiments, pulse "3,4" overlaps with pulse 3. Pulse "3,4" terminates before the next transition on lines L.2.j, that is, before pulse 5–8 of clock Clk.3.2.

Pulse 5–8 of clock Clk.3.2 starts when both clocks Clk.2.j are low and lasts sufficiently long to allow the outputs L.2.j to settle at the respective values of bits 5–8. Pulse 9–12 of clock Clk.3.1 starts before pulse "9,10" clock of Clk.2.1, when both clocks Clk.2.j are low. Pulse 9–12 lasts sufficiently long to allow the outputs L.2.j to settle at the respective values of bits 9–12. Such operation continues indefinitely.

The frequency of the signals on inputs D1, D2 of each cell 1701 is one-half the frequency on the cell output q. Therefore, the frequency on inputs D.j of converter 1310 is 1/N of the frequency on the converter output Q. Hence, at a given frequency of the serial output data the converter throughput is as high as that of a shift register P/S converter.

However, the number of simultaneously switching elements in some embodiments of converter 1310 is twice smaller than in a shift register having the same word length N. Indeed, the largest number of memory cells that can switch state simultaneously at one level is N/2, for level LogN. In some embodiments, the rising edges of clocks Clk.i.j do not coincide for different levels i, so that no two memory cells 230 of different levels switch simultaneously. Hence, at most N/2 memory cells 230 switch simultaneously, twice less than in a shift register P/S converter for words of the same length N. Consequently, in converter 1310 the peak transient current is low.

The total number of memory cells in P/S converter 1310 is 2N-2 versus 2N latches in a shift register. Reducing the number of memory cells reduces further the peak transient current and the power consumption.

The peak transient current and the power consumption are reduced further in some embodiments in which the cells 1701 of higher-numbered levels are slower. In FIG. 15, the width of each pulse of clocks Clk.3.1, Clk.3.2 is greater than the width of each pulse of clocks Clk.1.j. Hence, memory cells 230 of level 3 have more time to read data than the memory cells of level 1. In particular, some embodiments satisfy formula (4) given above. Hence, the memory cells of levels 3 and higher in such embodiments can be made slower.

In some embodiments, the memories cells of each level 3 and higher are twice slower than the memory cells of the previous level. All the clocks Clk.i.j of levels 2 and higher have the same duty cycle. In some such embodiments, equations (1) and (3) hold true for all i; and $H_{i+1}=2H_i \leq L_i$ for all i<LogN. In some such embodiments, the duty cycle of each clock of levels 2 and higher is at most ⅙.

Figure 16:
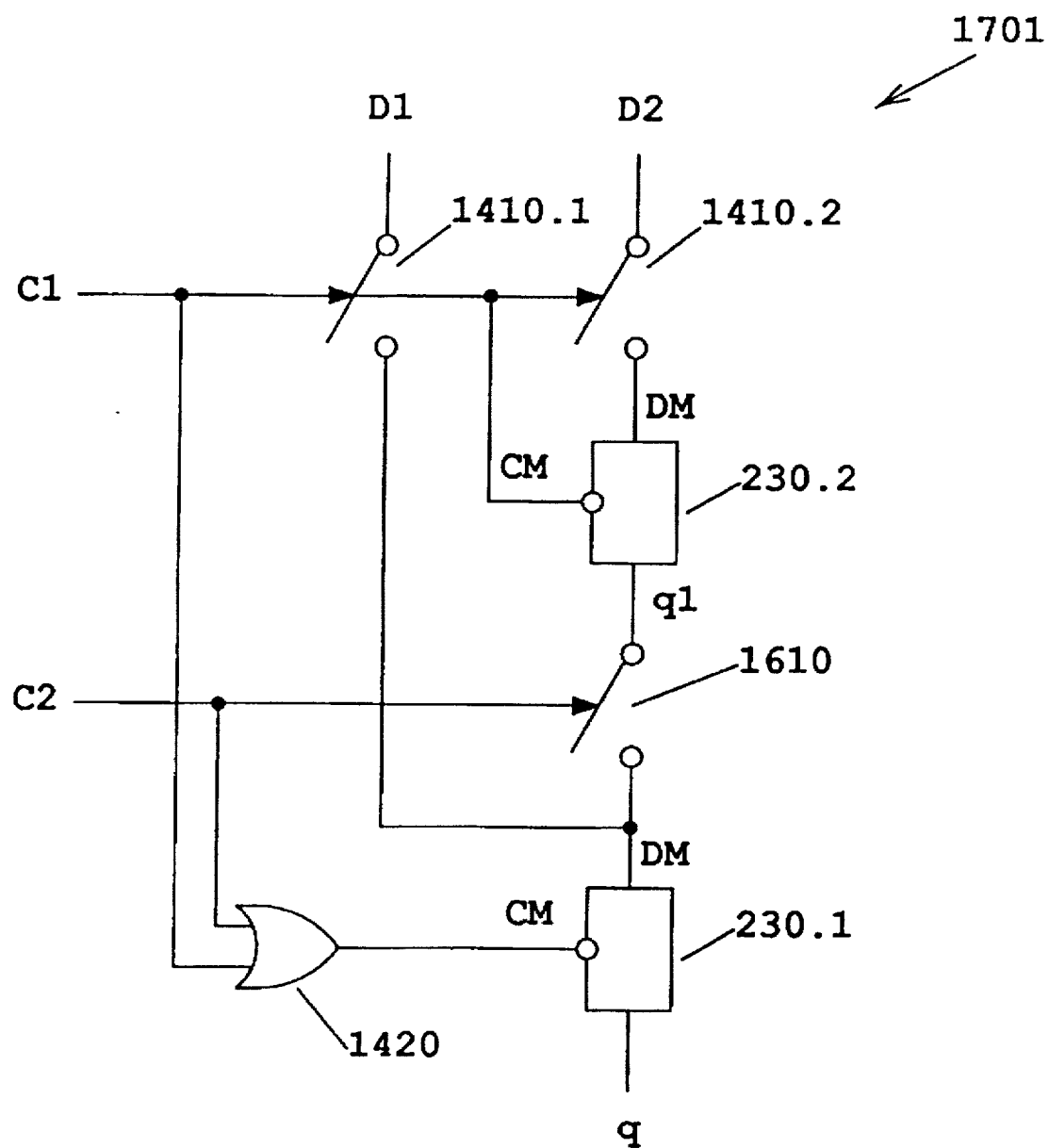
FIG. 16 is a diagram of a P/S cell used in some embodiments of the converter of FIG. 13.

FIG. 16 illustrates another embodiment of cell 1701. Inputs D1, D2 are connected to respective inputs DM of memory cells 230.1, 230.2 through respective switches 1410.1, 1410.2. When clock input C1 is high, switches 1410.1, 1410.2 are closed. When clock input C1 is low, switches 1410.1, 1410.2 are open. Each memory cell 230.i has the structure of FIG. 3. The output q1 of memory cell 230.2 is connected to the input DM of memory cell 230.1 through switch 1610. When clock input C2 is high, switch 1610 is closed. When clock input C2 is low, switch 1610 is open. The output q of memory cell 230.1 is the output of cell 1701. Clock input C1 is connected to clock input CM of memory cell 230.2. Clock inputs C1, C2 are ORed by OR gate 1420 whose output is connected to clock input CM of memory cell 230.1. In some embodiments, OR gate 1420 is not provided in every cell 1701 but a single OR gate 1420 is provided for a whole row of cells 1701. In such embodiments, the output of gate 1420 for row i is connected to the input CM of each memory cell 230.1 of each cell 1701 of row i.

Figure 17:
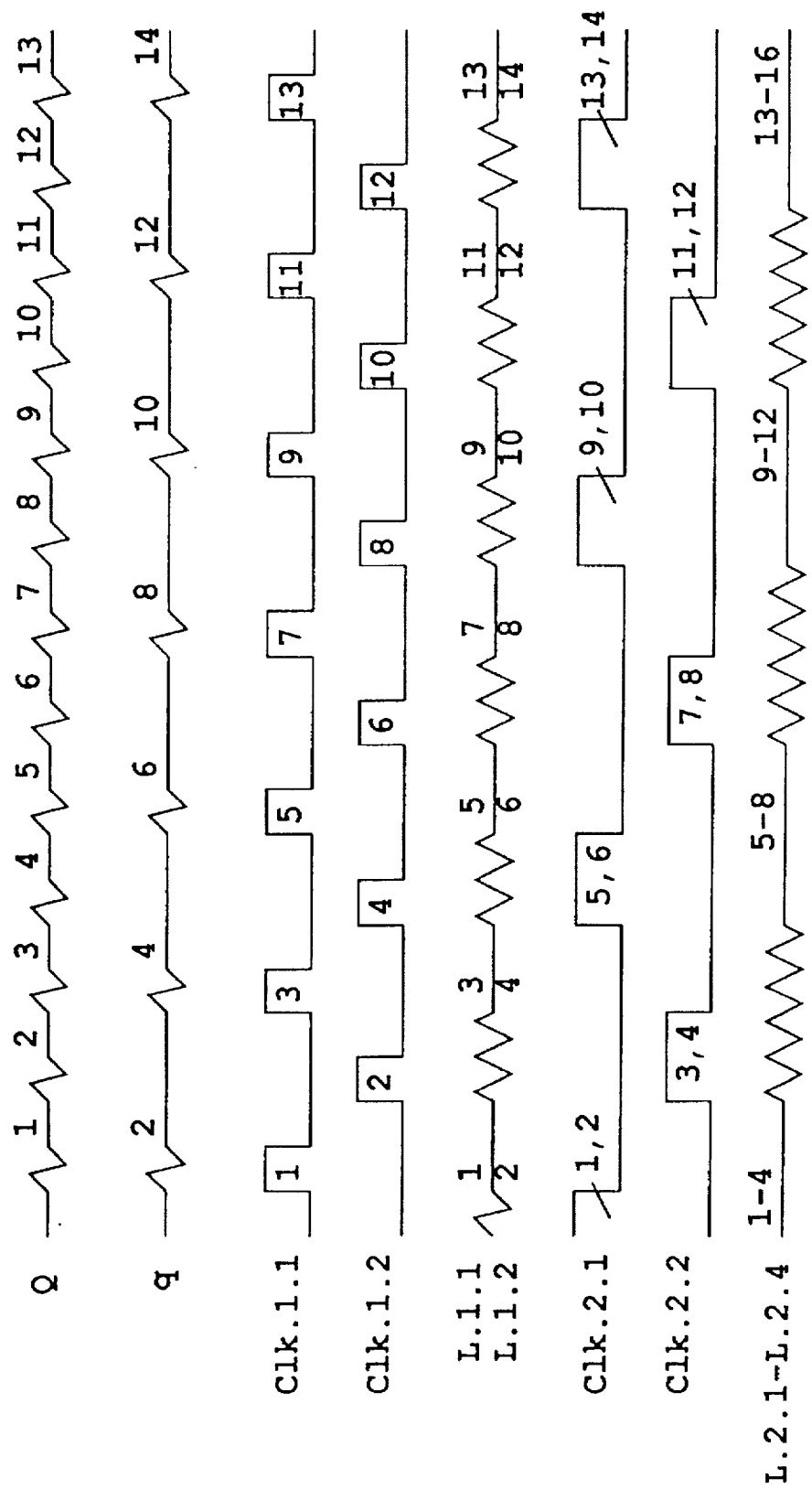
FIG. 17 is a timing diagram for the converter of FIG. 13 with a P/S cell of FIG. 16.

FIG. 17 illustrates the timing of P/S converter 1310 in which all cells 1701 have the structure of FIG. 16. The timing of signals Q, Clk.1.1, and Clk.1.2 is similar to that of FIG. 15. Node q1 in cell 1701.1.1 switches state on pulses of clock Clk.1.1. Inputs L.1.j, which are inputs Dj of cell 1701.1.1, can switch states when clock Clk.1.1 is low since the low value of clock Clk.1.1 prevents both of these inputs from affecting the cell's output q even when clock Clk.1.2 is high. In contrast, in FIG. 15, inputs L.1.j change their states when both clocks Clk.1.1, Clk.1.2 are low. Since the time interval when clock Clk.1.1 is low is larger than the time interval when both clocks Clk.1.1, Clk.1.2 are low, the embodiment of FIG. 17 allows more time for inputs L.1.j to switch their states. The memory cells 230 of level 2 can therefore be made slower, with corresponding reduction in the peak transient current.

Similarly, the inputs L.2.j can switch states when clock Clk.2.1 is low even when clock Clk.2.2 is high. Thus, the memory cells 230 of level 3, and similarly of higher-numbered levels, can be made slower. In some embodiments, the memory cells of each level starting with level 2 are twice slower than the memory cells of the previous level.

If all the cells 1701 at level LogN have the structure of FIG. 16, the number of latches that switch states simultaneously can reach N. However, making the latches slower reduces the peak transient current and the power consumption. Moreover, the latches of level LogN operate at the frequency of only 1/N of the frequency of the output data Q. Hence, the rate of change of the current at level LogN reaches its peak value at the lower frequency, increasing the P/S converter reliability.

Some embodiments use different clock pairs to clock different cells 1701 of the same level, allowing memory cells 230 to be slower. All the clock pairs are generated by clock generator 1702. In some such embodiments, clock pulses at inputs C2 of some of the cells 1701 overlap with clock pulses at inputs C1 of other cells 1701 of the same level, allowing each cell 1701 more time to read data.

Figure 18:
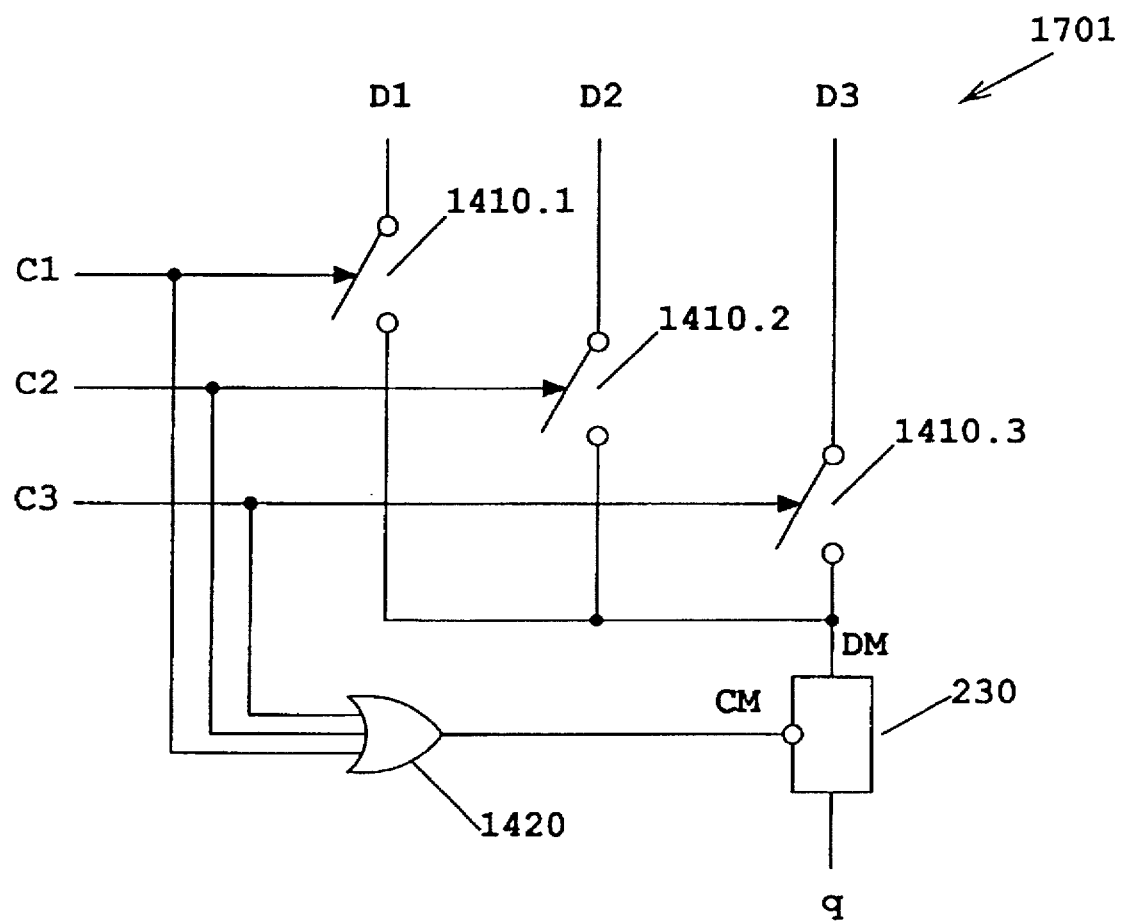
FIGS. 18 and 19 are diagrams of different embodiments of P/S cells according to the present invention.

Some P/S converters use P/S cells with branching coefficients (i.e., number of inputs) k>2, similarly to S/P converter 1010 (FIG. 10). Such a P/S cell is clocked by k non-overlapping clocks. In some embodiments, different P/S cells of the same level have different branching coefficients. One embodiment of a three-input P/S cell 1701 is shown in FIG. 18. Data inputs D1, D2, D3 of cell 1701 are connected to data input DM of memory cell 230 through respective switches 1410.1, 1410.2, 1410.3 controlled by respective clock inputs C1, C2, C3 which receive three respective non-overlapping clocks Clk.i.j, j=1, 2, 3. When clock input Cj is high, the respective switch 1410.j is closed. When clock input Cj is low, the respective switch 1410.j is open.

Memory cell 230 has the structure of FIG. 3.

Clock inputs C1, C2, C3 are ORed by OR gate 1420 whose output is connected to clock input CM of memory cell 230. Data output q of memory cell 230 is the data output of cell 1701. In some embodiments, a single OR gate 1420 is provided for a row of cells 1701.

Cells with larger branching coefficients k have a similar structure in some embodiments.

Figure 19:
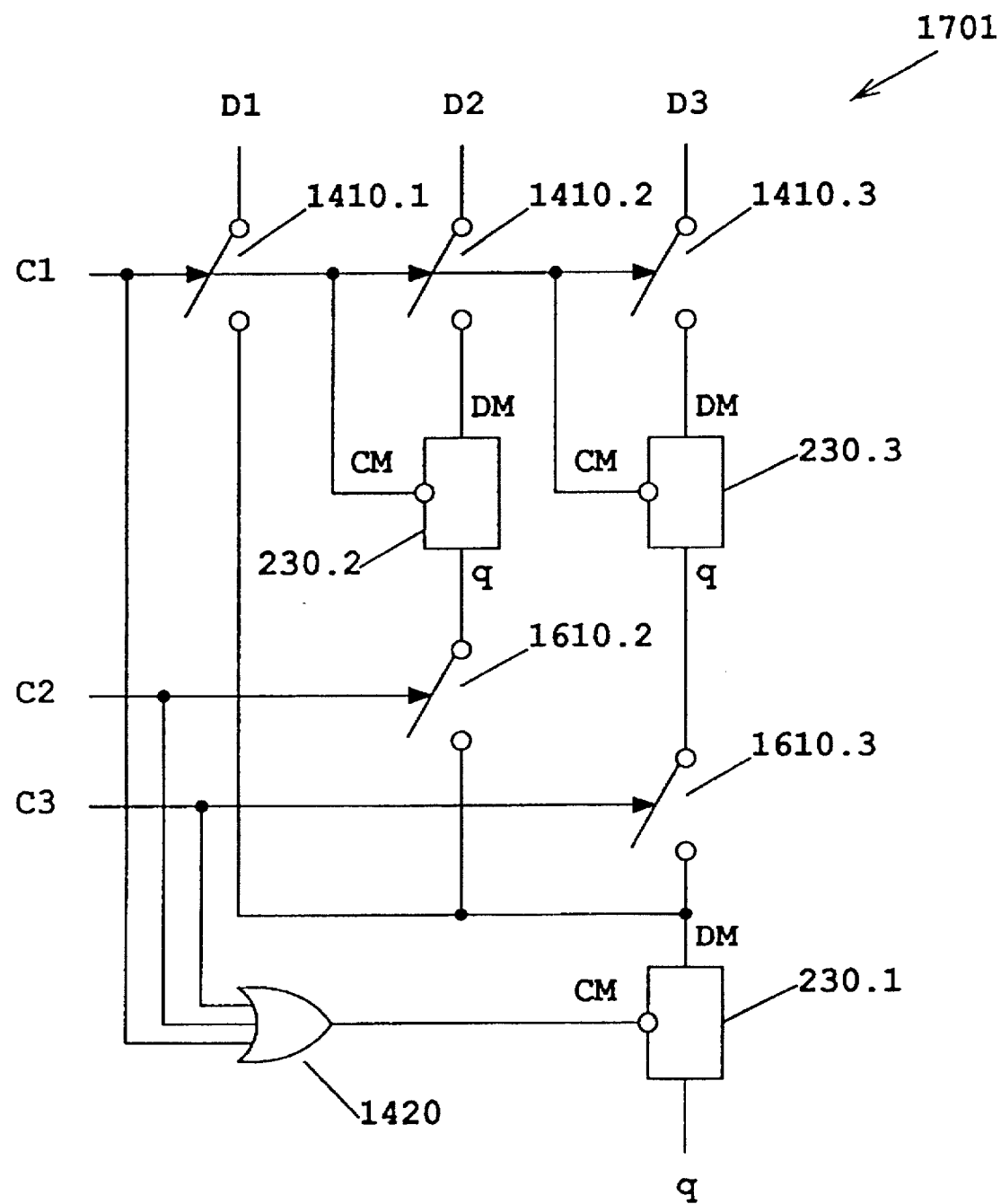

FIG. 19 illustrates another embodiment of a three-input cell 1701 that allows memory cells 230 to be slower at levels 2 and higher. In FIG. 19, data inputs D2, D3 are connected to respective data inputs DM of memory cells 230.2, 230.3 through respective switches 1410.2, 1410.3 controlled by clock input C1. Outputs q of memory cells 230.2, 230.3 are connected to data input DM of memory cell 230.1 through respective switches 1610.2, 1610.3 controlled by respective clock inputs C2, C3. Data input D1 of cell 1701 is connected to data input DM of memory cell 230.1 through switch 1410.1 controlled by clock input C1. Clock inputs C1, C2, C3 receive respective non-overlapping clocks Clk.i.j, j=1, 2, 3. Clock inputs C1, C2, C3 are ORed by OR gate 1420 whose output is connected to clock input CM of memory cell 230.1. The output q of memory cell 230.1 is the output of cell 1701.

In some embodiments, a single OR gate 1420 is provided for a row of memory cells 1701.

When clock input C1 is high, switches 1410.1, 1410.2, 1410.3 are closed. When clock input C1 is low, the three switches are open. When clock input C2 is high, switch 1610.2 is closed. When clock input C2 is low, switch 1610.2 is open. When clock input C3 is high, switch 1610.3 is closed. When clock input C3 is low, switch 1610.3 is open.

In cell 1701 of FIG. 19, when clock input C1 is low, data inputs D1, D2, D3 are prevented from affecting data output q of cell 1701. Hence, data inputs D1, D2, D3 can change states, without affecting the output of cell 1701, whenever clock input C1 is low even if clock inputs C2, C3 are high. Therefore, other cells or devices whose outputs are connected to inputs D1, D2, D3 have more time to change the states of these inputs than in FIG. 18 and hence can be slower at the same transfer frequency on output q of cell 1701.

Figure 20:
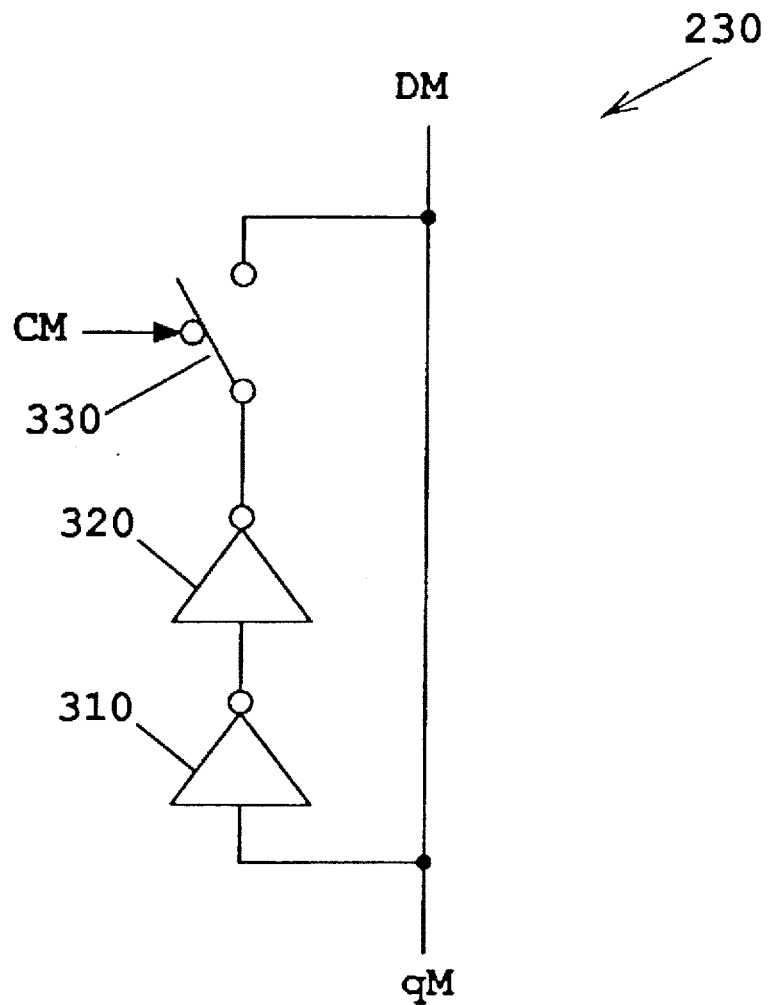
FIG. 20 is a circuit diagram of a memory cell used in some embodiments of S/P and P/S converters of the present invention.

FIG. 20 is a circuit diagram of memory cell 230 used in some embodiments of S/P and P/S converters instead of the memory cell of FIG. 3. In FIG. 20, the input DM is connected directly to output qM. Output qM is also connected to the input of inverter 310 whose output is connected to the input of inverter 320 whose output is connected to input DM through switch 330. When clock input CM is low, switch 330 is closed. When clock input CM is high, switch 330 is open.

In some embodiments, output qM is connected to the output of inverter 310. Thus, the data on output qM is the inverse of the data on input DM. If such an embodiment is used in S/P cell 1301 of FIG. 2 or P/S cell 1701 of FIG. 18, the data on the cell's output(s) are inverted.

In some embodiments of cell 1301 of FIG. 7, two of memory cells 230.1, 230.2, 230.3 invert the output DM and the third cell does not invert the output, so that both outputs q1, q2 provide inverted data or both outputs q1, q2 provide non-inverted data. In some embodiments of cell 1701 of FIG. 19, memory cell 230.1 inverts data but memory cells 230.2, 230.3 do not invert data. Thus, in some embodiments one or more cells 1301, 1701 provide data in the inverted form.

Some embodiments of S/P and P/S converters described herein are used in memories having serial access. Examples of such memories are described in U.S. Pat. No. 4,347,587 issued Aug. 31, 1982 to Rao. As described in that patent, in a serial read operation, a row of a memory array is moved into a shift register. From the shift register the row data are shifted out to a serial output terminal. Similarly, in a serial write operation, the data are shifted serially into the shift register, and then are transferred from the shift register into a selected row.

Figure 21:
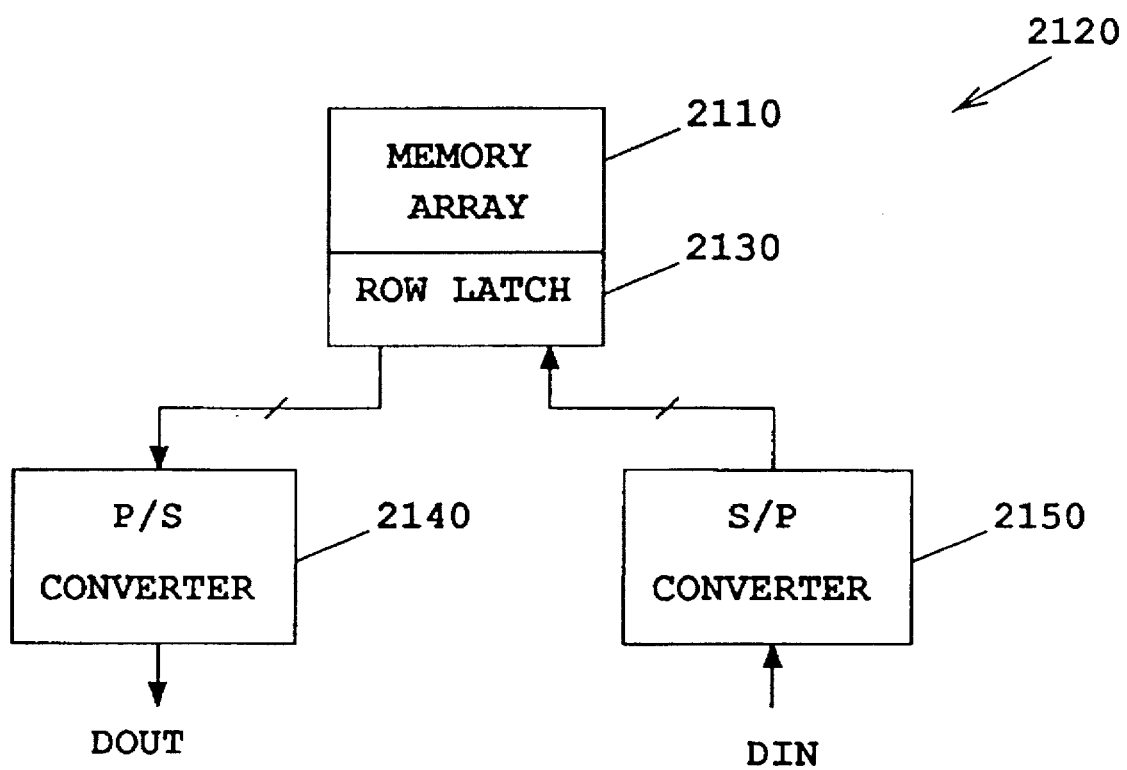
FIG. 21 is a block diagram of a memory using S/P and P/S converters of the present invention.

In such a memory, the shift register acts as a P/S converter in a read operation and an S/P converter in a write operation. In some embodiments, the shift register is replaced by P/S and S/P P-register converters as illustrated in FIG. 21. Memory array 2110 of memory 2120 is a conventional array of DRAM, SRAM, or other types of memory cells. In a serial read operation, data from a selected row of memory array 2110 are transferred in parallel to row latch 2130 using techniques known in the art. Latch 2130 provides the row in parallel to inputs of P/S P-register converter 2140. Converter 2140 provides the row data serially on memory output DOUT.

In a serial read operation, the data are provided serially on input DIN connected to the input of S/P P-register converter 2150 which outputs the data in parallel to row latch 2130. From latch 2130, the data are written in parallel to a selected row of memory array 2110. The row selection in memory array 2110 in serial read and write operations is accomplished using methods known in the art.

In some embodiments, terminals DOUT and DIN are combined in a single terminal. A tri-state gate has an input connected to the output of P/S converter 2140 and an output connected to the terminal. Another tri-state gate has an input connected to the terminal and an output connected to the input of S/P converter 2150. One of the tri-state gates is enabled and the other tri-state is disabled to enable either input or output, as is known in the art.

In some embodiments, a separate terminal or terminals are used for random access of memory 2120 as described, for example, in the aforementioned U.S. Pat. No. 4,347,587.

In some embodiments, P/S converter 2140 and S/P converter 2150 share a single clock generator performing the functions of clock generators 1302, 1702.

In some embodiments, a P/S P-register converter, such as converter 1310 or another converter described above, is used as a multiplexer that provides on output Q the data from a selected one of inputs D.j. An input D.j is selected by selecting, at each level i, one of clocks Clk.i.1, Clk.i.2 to be driven high and the other of the two clocks to be driven low. At level 1, driving the clock Clk.1.1 high and the clock Clk.1.2 low selects input L.1.1 for providing data on output Q. Driving the clock Clk.1.1 low and the clock Clk.1.2 high selects the input L.1.2. Similarly, at level 2, when clock Clk.2.1 is high and clock Clk.2.2 is low, inputs L.2.1, L.2.2 are selected to drive their data on respective outputs L.1.1, L.1.2. If at the same time clock Clk.1.1 is high and Clk.1.2 is low, input L.1.1 is selected, and the data from input L.2.1 is provided on output Q. If clock Clk.1.2 is high, input L.1.2 is selected, and the data from input L.2.2 is driven to output Q.

Similarly, if clocks Clk.2.2 and Clk.1.1 are high, input L.2.3 is selected to drive its data to output Q. If Clk.2.2 and Clk. 1.2 are high, input L.2.4 is selected.

Similar reasoning shows that selecting at each level i one of the two clocks Clk.i.1, Clk.1.2 to be driven high and the other of the two clocks to be driven low simultaneously at all levels i selects precisely one input D.j for providing its data on output Q.

Similarly, in some embodiments, an S/P P-register converter such as converter 110 acts as a demultiplexer. Driving simultaneously, at each level i, one of the two clocks Clk.i.1, Clk.1.2 high and the other of the two clocks low selects one of outputs $Q_i$ to provide the data from input DIN.

In some embodiments, P/S P-register converters functioning as multiplexers are used in memories as Y-decoders (that is, column decoders) in random read operations. Thus, in some embodiments of memory 2120 of FIG. 21, terminal DOUT is used both for serial and random read operations. The serial read operations are performed as described above. In random read operations, P/S converter 2140 is used as a Y-decoder to select a single column based on a column address (not shown) and to provide the data from the selected column to terminal DOUT.

Similarly, in some embodiments the terminal DIN is used for both serial and random write operations. In random write operations, S/P converter 2150 functioning as a demultiplexer is used as a Y-decoder to provide the data on input DIN to a row latch 2130 position corresponding to a column selected by a column address. From latch 2130, the input data are written to the selected column. This operation may destroy data in the other columns in the row selected by the row address.

While the invention has been illustrated with respect to the embodiments described above, other embodiments and variations are within the scope of the invention. In particular, the invention is not limited by any particular structure of an S/P cell, a P/S cell, a latch or a memory cell. In some embodiments, the switches, the inverters, and the latches 230 include one or more of the structures described in N.H.E. Weste, K. Eshraghian, "Principles of CMOS VLSI Design: A System's Perspective", (2nd Ed. 1993) at pages 7–11, 19–20 and 318–322 hereby incorporated herein by reference. Some embodiments use capacitors for memory cells. Some embodiments are implemented in CMOS technology. Other embodiments use NMOS, PMOS, bipolar, BiCMOS, or other kinds of technology. In some embodiments, for each level i, each non-overlapping clock Clk.i.j is at 0 or in a transition between 0 and 1 only when the other clocks Clk.i.j are at 1. Other embodiments and variations are within the scope of the invention as defined by the following claims.

I claim:

1. A circuit for processing a serial stream of data units, the circuit comprising:

an input I1 for receiving the serial stream of data units;

a plurality of cells C.i.j wherein:

i is an integer varying from 1 to L1 inclusive, L1 being an integer greater than 1, each cell C.i.j being termed herein as a cell of level i; and for each given i, the number j is an integer varying from 1 to k(i) inclusive, wherein k(i) is an integer greater than or equal to 1;

wherein each cell C.i.j has an input and a plurality of outputs, wherein the input of cell C.1.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and wherein the circuit comprises means for controlling the storage devices to cause each storage device SD(C.i.j), for each given i and j, to store data units provided on the input of the respective cell C.i.j and to provide the stored data units to an output of cell C.i.j so that successive data units provided on the input of cell C.i.j are stored by different storage devices SD(C.i.j) and so that for at least one storage device SD of a cell C of a level i1>1, while the storage device SD provides on an output of the cell C a data unit stored by the device SD, at least one other data unit is read by another storage device of a cell of a level less than i1 to be subsequently written to the storage device SD.

2. The circuit of claim 1 wherein each storage device SD comprises a latch.

3. The circuit of claim 1 wherein at any given time at most $2^{L1-1}$ storage devices read data.

4. The circuit of claim 1 wherein at any given time only storage devices of at most one level read data.

5. The circuit of claim 1 wherein L1>2.

6. The circuit of claim 1 wherein at least one storage device SD1 of a cell C1 is to invert a data unit read from an input of cell C1 and to provide the data unit on an output of cell C1 in an inverted form.

7. A circuit for providing a serial stream of data units, the circuit comprising:

an output O1 for providing a serial stream of data units;

a plurality of cells C.i.j, wherein i is an integer varying from 1 to L1 inclusive, L1 being an integer greater than 1, each cell C.i.j being termed herein as a cell of level i; and for each given i, the number j is an integer varying from 1 to k(i) inclusive, wherein k(i) is an integer greater than or equal to 1;

wherein each cell C.i.j has an output and a plurality of inputs, wherein the output of cell C.I.1 of level 1 is coupled to the output O1, and the output of each cell of each level i>1 is coupled to an input of a cell of level i−1, wherein for at least one level i0>1 the outputs of at least two different cells of level i0 are coupled to different inputs of one or more cells of i0−1;

wherein each cell C.i.j comprises one or more storage devices to store data read from one or more inputs of the cell and to provide data to an output of the cell; and wherein the circuit comprises means for controlling the cells to cause each cell C.i.j, for each given i and j, to store, in its one or more storage devices, data units provided on an input of the respective cell C.i.j and to provide the stored data units to the output of cell C.i.j so that successive data units provided on the output of cell C.i.j are read from different inputs of the cell C.i.j and so that for at least one cell C of a level i1<L1, while the cell C provides on its output a data unit stored by the cell, at least one other data unit is read by another cell of a level greater than i1 to be subsequently written to the cell C.

8. The circuit of claim 7 wherein each storage device comprises two inverters and means for coupling an output of each of the two inverters to an input of the other one of the two inverters.

9. The circuit of claim 7 wherein at any given time at most $2^{L1-1}$ storage devices read data.

10. The circuit of claim 7 wherein at any given time only storage devices of at most one level read data.

11. The circuit of claim 7 wherein L1>2.

12. A circuit for processing a serial stream of data units, the circuit comprising:

an input I1 for receiving the serial stream of data units;

a plurality of cells C.i.j, wherein i is an integer varying from 1 to L1 inclusive, L1 being an integer greater than 1, each cell C.i.j being termed herein as a cell of level i;

wherein each cell C.i.j has an input and a plurality of outputs, wherein the input of cell C.i.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and wherein the circuit comprises a control circuit for controlling the storage devices to cause each storage device SD(C.i.j), for each given i and j, to store data units provided on the input of the respective cell C.i.j and to provide the stored data units to an output of cell C.i.j so that successive data units provided on the input of cell C.i.j are stored by different storage devices SD(C.i.j) and so that for at least one storage device SD1 of a cell C1 of a level i1<L1, when the storage device SD1 reads data to be subsequently written to another storage device SD2 of a level greater than i1, the storage device SD2 is disabled from reading data.

13. A circuit comprising:

an input I1;

a plurality of cells C.i.j wherein i is an integer varying from 1 to L1 inclusive, L1 being an integer greater than 1, each cell C.i.j being termed herein as a cell of level i;

wherein each cell C.i.j has an input and a plurality of outputs, wherein the input of cell C.I.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j);

wherein the circuit comprises a circuit for controlling the storage devices to cause each storage device SD(C.i.j), for each given i and j, to store data units provided on the input of the respective cell C.i.j and to provide the stored data units to an output of cell C.i.j so that successive data units provided on the input of cell C.i.j are stored by different storage devices SD(C.i.j); and wherein at least one storage device of a level i>1 is slower than a storage device of a level less than i.

14. The circuit of claim 13 wherein each storage device comprises a latch.

15. The circuit of claim 13 wherein L1>2, and for each level i>2 each storage device of level i is slower than any storage device of level i−1.

16. The circuit of claim 15 wherein for each level i>2 each storage device of level i is at least twice slower than any storage device of level i−1.

17. The circuit of claim 16 wherein each storage device of level 2 is at least twice slower than any storage device of level 1.

18. A circuit comprising:

an input I1;

a plurality of cells C.i.j wherein i is an integer varying from 1 to L1 inclusive, L1 being an integer greater than 1, each cell C.i.j being termed herein as a cell of level i;

wherein each cell C.i.j has an input and a plurality of outputs, wherein the input of cell C.i.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and wherein the circuit comprises a control circuit for controlling the storage devices to cause each storage device SD(C.i.j), for each given i and j, to store data units provided on the input of the respective cell C.i.j and to provide the stored data units to an output of cell C.i.j so that successive data units provided on the input of cell C.i.j are stored by different storage devices SD(C.i.j) and so that for at least one storage device SD1 of a cell C1 of a level i1>1, the storage device SD1 is enabled to read data from the input of cell C1 only when another storage device SD2 capable of changing the input of cell C1 is disabled from changing the input of cell C1.

19. The circuit of claim 18 wherein the storage device SD2 belongs to a cell of level i1−1.

20. The circuit of claim 18 wherein a cell of any given level greater than 1 is enabled to read data only when all the storage devices that drive the cell outputs at the previous level are disabled from changing their outputs.

21. The circuit of claim 18 wherein all the outputs of the cell C1 are synchronized by a single control signal generated by the control circuit so that the cell C1 provides new data simultaneously on all its outputs.

22. The circuit of claim 18 wherein for any level i, all the outputs of all the cells of the level i are synchronized by a single control signal generated by the control circuit so that new data are provided on all the outputs of the cells of level i simultaneously.

23. A circuit for processing a serial stream of data units, the circuit comprising:

an input I1 for receiving the serial stream of data units;

a plurality of cells C.i.j wherein i is an integer varying from 1 to L1 inclusive, L1 being an integer greater than 1, each cell C.i.j being termed herein as a cell of level i;

wherein each cell C.i.j has an input and a plurality of outputs, wherein the input of cell C.I.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and wherein the circuit comprises a clock generator for generating clocks for controlling the storage devices so that at least one cell has at least two storage devices SD1, SD2 controlled by respective two non-overlapping clocks CLK1, CLK2 such that each one of the clocks CLK1, CLK2 is at a predetermined level both while the other one of the clocks is at a predetermined level and during transitions of the other one of the clocks.

24. The circuit of claim 23 wherein each storage device comprises a latch.

25. The circuit of claim 23 wherein the clock generator is operable to:

(1) cause the clock CLK1 to disable the storage device SD1 from reading data when the storage device SD2 is enabled to read data and during transitions of clock CLK2; and (2) cause the clock CLK2 to disable the storage device SD2 from reading data when the storage device SD1 is enabled to read data and during transitions of the clock CLK1.

26. The circuit of claim 23 wherein all the storage devices of any given level are controlled by a plurality of non-overlapping clocks of the same frequency.

27. The circuit of claim 23 wherein a clock that controls storage devices of any level i>1 has at most half the frequency of any clock that controls any storage device of any level less than i.

28. A circuit for processing a serial stream of data units, the circuit comprising:

an input I1 for receiving the serial stream of data units;

a plurality of cells C.i.j wherein i is an integer varying from 1 to L1 inclusive, L1 being an integer greater than 1, each cell C.i.j being termed herein as a cell of level i;

wherein each cell C.i.j has an input and a plurality of outputs, wherein the input of cell C.1.1 of level 1 is coupled to the input I1, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and wherein the circuit comprising a clock generator for generating clocks to control the storage devices such that for at least one storage device SD of a cell of a level i1>1, a transition time of the clock controlling the storage device SD is greater than a transition time of a clock controlling a storage device of a level less than i1.

29. The circuit of claim 28 wherein a transition time of each clock controlling a storage device of any level i2>1 is at least twice longer than a transition time of each clock controlling any storage device of the previous level i2−1.

30. A circuit comprising:

an input I1;

a plurality of storage devices SD1.1, . . . SD1.k whose data inputs are coupled to the input I1, where k≧2;

k−1 storage devices SD2.1 . . . SD2.k−1 such that for every given i from 1 to k−1 inclusive, a data input of storage device SD2.i is coupled to a data output of respective storage device SD1.1; and a circuit for generating control signals for the storage devices such that all the k−1 devices SD2.1, . . . SD2.k−1 and the device SD1.k provide newly-read data simultaneously, but the devices SD1.1, . . . SD1.k do not provide newly read data simultaneously.

31. The circuit of claim 30 wherein k=2.

32. The circuit of claim 30 wherein control signals for controlling different devices SD1.1, . . . SD1.k are non-overlapping clocks such that each of the clocks is at a predetermined level during transitions of any other one of the clocks.

33. The circuit of claim 30 wherein the control signals are to cause successive data units on the input of I1 to be read by different ones of storage devices SD1.1, . . . SD1.k.

34. A memory comprising:

a memory array;

a plurality of cells C.i.j for receiving data and writing data to the memory array, wherein i is an integer varying from 1 to L1 inclusive, L1 being an integer greater than 1, each cell C.i.j being termed herein as a cell of level L1;

wherein each cell C.i.j has an input and a plurality of outputs, wherein an input I1 of cell C.1.1 of level 1 is for receiving data to be written to the memory array, and the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices; and the memory further comprises:

a control circuit for controlling the storage devices to convert a serial stream of data on the input I1 to parallel data on outputs of at least some cells C.i.j; and a circuit for writing the parallel data to the memory array.

35. The memory of claim 34 wherein the parallel data are provided on the outputs of the cells of level L1.

36. The memory of claim 34 wherein the memory array comprises dynamic random access memory cells.

37. The memory of claim 34 wherein the control circuit is operable to control the storage devices so that, for at least one storage device SD of a cell C of a level i1>1, while the storage device SD provides on an output of the cell C a data unit stored by the device SD, at least one other data unit is read by another storage device of a cell of a level less than i1 to be subsequently written to the storage device SD.

38. The memory of claim 37 wherein the control circuit is also operable to control the storage devices to enable the cells to function as a multiplexer whose input is the input I1 and whose outputs are the outputs of the cells of level L1.

39. A method for converting serial data to parallel data, the method comprising:

receiving the serial data at an input I1 of a cell C.1.1, wherein cell C.1.1 is one of a plurality of cells C.i.j, wherein i is an integer varying from 1 to L1 inclusive, L1 being an integer greater than 1, each cell C.i.j being termed herein as a cell of level i;

wherein each cell C.i.j has an input and a plurality of outputs, wherein the input of each cell of each level i>1 is coupled to an output of a cell of level i−1, wherein for at least one level i0>1 the inputs of at least two different cells of level i0 are coupled to different outputs of one or more cells of level i0−1;

wherein each cell C.i.j comprises a plurality of storage devices SD(C.i.j); and the method comprises controlling the storage devices to cause each storage device SD(C.i.j), for each given i and j, to store data units provided on the input of the respective cell C.i.j and to provide the stored data units to an output of cell C.i.j so that successive data units provided on the input of cell C.i.j are stored by different storage devices SD(C.i.j) and so that the cell C.1.1 is disabled from reading data from the input I1 during data transitions on the input I1.

40. A circuit for providing a serial stream of data units, the circuit comprising:

an output O1 for providing a serial stream of data units;

a plurality of cells C.i.j, wherein i is an integer varying from 1 to L1 inclusive, L1 being an integer greater than 1, each cell C.i.j being termed herein as a cell of level i;

wherein each cell C.i.j has an output and a plurality of inputs, wherein the output of cell C.1.1 of level 1 is coupled to the output O1, and the output of each cell of each level i>1 is coupled to an input of a cell of level i−1, wherein for at least one level i0>1 the outputs of at least two different cells of level i0 are coupled to different inputs of one or more cells of level i0−1;

wherein each cell C.i.j comprises one or more storage devices to read data from one or more inputs of the cell and to provide data to an output of the cell; and wherein the circuit comprises a control circuit for controlling the storage devices to cause each cell C.i.j, for each given i and j, to store, in its one or more storage devices, data units provided on an input of the respective cell C.i.j and to provide the stored data units to the output of cell C.i.j so that successive data units provided on the output of cell C.i.j are read from different inputs of the cell C.i.j and so that for at least one cell C1 of a level i1>1, when the cell C1 reads data to be subsequently written to another cell C2 of a level less than i1, the cell C2 is disabled from reading data.

41. A circuit for providing a serial stream of data units, the circuit comprising:

an output O1 for providing a serial stream of data units;

a plurality of cells C.i.j, wherein i is an integer varying from 1 to L1 inclusive, L1 being an integer greater than 1, each cell C.i.j being termed herein as a cell of level i;

wherein each cell C.i.j has an output and a plurality of inputs, wherein the output of cell C.i.1 of level 1 is coupled to the output O1, and the output of each cell of each level i>1 is coupled to an input of a cell of level i−1, wherein for at least one level i0>1 the outputs of at least two different cells of level i0 are coupled to different inputs of one or more cells of level i0−1;

wherein each cell C.i.j comprises one or more storage devices to read data from one or more inputs of the cell and to provide data to an output of the cell; and wherein the circuit comprises a control circuit for controlling the storage devices to cause each cell C.i.j, for each given i and j, to store, in its one or more storage devices, data units provided on an input of the respective cell C.i.j and to provide the stored data units to the output of cell C.i.j so that successive data units provided on the output of cell C.i.j are read from different inputs of the cell C.i.j;

wherein at least one storage device of a level i>1 is slower than a storage device of a level less than i.

42. The circuit of claim 41 wherein each storage device comprises two inverters and means for coupling an output of each of the two inverters to an input of the other one of the two inverters.

43. The circuit of claim 41 wherein L1>2, and for each level i>2 each storage device of level i is slower than any storage device of level i−1.

44. The circuit of claim 43 wherein for each level i>2 each storage device of level i is at least twice slower than any storage device of level i−1.

45. The circuit of claim 44 wherein each storage device of level 2 is at least twice slower than any storage device of level 1.

46. A circuit for providing a serial stream of data units, the circuit comprising:

an output 01 for providing a serial stream of data units;

a plurality of cells C.i.j, wherein i is an integer varying from 1 to L1 inclusive, L1 being an integer greater than 1, each cell C.i.j being termed herein as a cell of level i;

wherein each cell C.i.j has an output and a plurality of inputs, wherein the output of cell C.i.1 of level 1 is coupled to the output 01, and the output of each cell of each level i>1 is coupled to an input of a cell of level i−1, wherein for at least one level i0>1 the outputs of at least two different cells of level i0 are coupled to different inputs of one or more cells of level i0−1;

wherein each cell C.i.j comprises one or more storage devices to read data from one or more inputs of the cell and to provide data to an output of the cell; and wherein the circuit comprises means for controlling the storage devices to cause each cell C.i.j, for each given i and j, to store, in its one or more storage devices, data units provided on an input of the respective cell C.i.j and to provide the stored data units to the output of cell C.i.j so that successive data units provided on the output of cell C.i.j are read from different inputs of the cell C.i.j and so that for at least one cell C1 of a level i1<L1, the cell C1 is enabled to read data from an input of cell C1 only when another cell C2 capable of changing said input of cell C1 is disabled from changing said input of cell C1.

47. The circuit of claim 46 wherein the cell C2 is a cell of level i1+1.

48. The circuit of claim 46 wherein a cell of any given level i2<L1 is enabled to read data only when all the cells of level i2+1 are disabled from changing their outputs.

49. The circuit of claim 46 wherein all the inputs of the cell C1 are synchronized by a single control signal generated by the control circuit so that the cell C1 reads new data simultaneously from all its inputs.

50. The circuit of claim 46 wherein for any level i, all the inputs of all the cells of level i are synchronized by a single control signal generated by the control circuit so that all the cells of level i read new data from all their inputs simultaneously.

51. A circuit for providing a serial stream of data units, the circuit comprising:

an output 01 for providing a serial stream of data units;

a plurality of cells C.i.j, wherein i is an integer varying from 1 to L1 inclusive, L1 being an integer greater than 1, each cell C.i.j being termed herein as a cell of level i;

wherein each cell C.i.j has an output and a plurality of inputs, wherein the output of cell C.i.1 of level 1 is coupled to the output 01, and the output of each cell of each level i>1 is coupled to an input of a cell of level i−1, wherein for at least one level i0>1 the outputs of at least two different cells of level i0 are coupled to different inputs of one or more cells of level i0−1; and wherein the circuit comprises a clock generator for generating non-overlapping clocks for controlling the cells so that for at least one cell C1 having at least first and second inputs, data from the first and second inputs are provided on the cell output under the control of respective two non-overlapping clocks CLK1 and CLK2 such that each one of the clocks CLK1, CLK2 is at a predetermined level both while the other one of the clocks is at a predetermined level and during transitions of the other one of the clocks.

52. The circuit of claim 51 wherein each cell is to read data into a storage device comprising two inverters and means for coupling an output of each of the two inverters to an input of the other one of the two inverters.

53. The circuit of claim 51 wherein the clock generator is operable to:

(1) cause the clock CLK1 to disable providing data from the first input on the cell output when the clock CLK2 enables providing data from the second input on the cell output and during transitions of clock CLK2; and (2) cause the clock CL2 to disable providing data from the second input on the cell output when the clock CLK2 enables providing data from the first input on the cell output and during transitions of clock CLK1.

54. The circuit of claim 51 wherein all the cells of any given level are controlled by a plurality of non-overlapping clocks of the same frequency.

55. The circuit of claim 51 wherein a clock that controls a cell of any level i>1 has at most half the frequency of any clock that controls any cell of any level less than i.

56. A circuit for parallel-to-serial data conversion, the circuit comprising:

a plurality of inputs I1, . . . , Ik, where k>1;

an output;

a plurality of storage devices SD.1, . . . SD.k to read data from respective inputs I1, . . . Ik; and a circuit for generating control signals so that:

(1) the devices SD.1, . . . SD.k read data from respective inputs I1, . . . Ik simultaneously, and the device SD.1 provides data on said output, and then (2) the device SD.1 sequentially reads the data from the devices SD1.2, . . . SD1.k and provides the data on said output.

57. The circuit of claim 56 wherein k=2.

58. The circuit of claim 56 wherein a control signal for controlling an operation of reading the data from inputs I1, ... Ik into respective devices SD.1, ... SD.k and one or more control signals that control reading data from respective one or more devices SD.2, ... SD.k into the device SD.1, are non-overlapping clocks such that each of the clocks is at a predetermined level during transitions of any other one of the clocks.

59. A memory comprising;

a memory array;

a plurality of cells C.i.j, wherein i is a integer varying from 1 to L1 inclusive, L1 being an integer greater than 1, each cell C.i.j being termed herein as a cell of level i, wherein parallel data are to be read from the memory array to inputs of at least some of the cells C.i.j;

wherein each cell C.i.j has an output and a plurality of inputs, wherein an output 01 of cell C.1.1 of level 1 is for sequentially providing data read from the memory array, and the output of each cell of each level l>1 is coupled to an input of a cell of level i−1, wherein for at least one level i0>1 the outputs of at least two different cells of level i0 are coupled to different inputs of one or more cells of level i0-1;

wherein each cell C.i.j comprise one or more storage devices to read data from one or more inputs of the cell and to provide data to an output of the cell; and wherein the memory further comprises a control circuit for controlling the cells to read parallel data from the memory array and convert the parallel data to serial data on the output 01.

60. The memory of claim 59 wherein the parallel data are to be read from the memory array to the inputs of the cells of level L1.

61. The memory of claim 59 wherein the memory array comprises dynamic random access memory cells.

62. The memory of claim 59 wherein the control circuit is operable to control the cells so that, for at least one cell C of a level i1<L1, while the cell C provides on its output a data unit stored by the cell, at least one other data unit is read by another cell of a level greater than i1 to be subsequently written to the cell C; and the control circuit is also operable to control the storage devices to enable the cells to function as a decoder to select one data unit of the parallel data and to provide the data unit to the output 01.

* * * * *